(12) United States Patent
Yun et al.

(10) Patent No.: US 12,058,889 B2
(45) Date of Patent: Aug. 6, 2024

(54) DISPLAY DEVICE

(71) Applicant: Samsung Display Co., Ltd., Yongin-Si (KR)

(72) Inventors: Suyeon Yun, Yongin-si (KR); Minsoo Kim, Yongin-si (KR); Yoona Kim, Yongin-si (KR); Seongmin Wang, Yongin-si (KR); Anna Ryu, Yongin-si (KR); Jeehyun Lee, Yongin-si (KR); Heesoon Jeong, Yongin-si (KR); Byunghee Choi, Yongin-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 310 days.

(21) Appl. No.: 17/530,387

(22) Filed: Nov. 18, 2021

(65) Prior Publication Data
US 2022/0165806 A1    May 26, 2022

(30) Foreign Application Priority Data

Nov. 24, 2020    (KR) .................. 10-2020-0159083

(51) Int. Cl.
*H01L 27/14*    (2006.01)
*H10K 59/121*    (2023.01)
(Continued)

(52) U.S. Cl.
CPC ....... *H10K 59/121* (2023.02); *H10K 59/1213* (2023.02); *H10K 59/1216* (2023.02);
(Continued)

(58) Field of Classification Search
CPC ............. H10K 59/121; H10K 59/1213; H10K 59/1216; H10K 59/126; H10K 59/131;
(Continued)

(56) References Cited

U.S. PATENT DOCUMENTS

| 7,675,492 B2 | 3/2010 | Park et al. |
| 8,148,729 B2 * | 4/2012 | Kim ..................... G09G 3/3225 257/40 |

(Continued)

FOREIGN PATENT DOCUMENTS

| KR | 10-2020-0013819 A | 2/2020 |
| KR | 10-2020-0066500 A | 6/2020 |

(Continued)

*Primary Examiner* — Tan N Tran
(74) *Attorney, Agent, or Firm* — Innovation Counsel LLP

(57) ABSTRACT

An embodiment of a display device includes: a first display area; a second display area including a transmission area; a third display area between the first display area and the second display area; and a plurality of pixel circuits in the third display area and electrically connected to the plurality of third light-emitting elements, respectively. Each of the plurality of pixel circuits includes: a first thin-film transistor including a first semiconductor layer and a first gate electrode overlapping at least a portion of the first semiconductor layer; a second thin-film transistor including a second semiconductor layer including a material different from that of the first semiconductor layer and a second gate electrode overlapping at least a portion of the second semiconductor layer; and a bottom shielding layer below the second semiconductor layer and overlapping at least a portion of the second semiconductor layer on a plane.

18 Claims, 8 Drawing Sheets

(51) Int. Cl.
*H10K 59/126* (2023.01)
*H10K 59/131* (2023.01)
*H10K 59/65* (2023.01)
*H01L 27/12* (2006.01)
*H01L 29/786* (2006.01)

(52) U.S. Cl.
CPC ......... *H10K 59/126* (2023.02); *H10K 59/131* (2023.02); *H10K 59/65* (2023.02); *H01L 27/1225* (2013.01); *H01L 27/124* (2013.01); *H01L 27/1251* (2013.01); *H01L 27/1255* (2013.01); *H01L 29/78633* (2013.01); *H01L 29/78675* (2013.01); *H01L 29/7869* (2013.01)

(58) Field of Classification Search
CPC .... H10K 59/65; H10K 59/12; H01L 27/1225; H01L 27/124; H01L 27/1251; H01L 27/1255; H01L 29/78633; H01L 29/78675; H01L 29/7869

USPC .................................................. 257/59, 72
See application file for complete search history.

(56) References Cited

U.S. PATENT DOCUMENTS

| | | | |
|---|---|---|---|
| 10,340,472 B2 | 7/2019 | Kim et al. | |
| 10,403,764 B2 | 9/2019 | Kim | |
| 10,818,874 B2 | 10/2020 | Park | |
| 10,847,593 B2 | 11/2020 | Kim et al. | |
| 11,417,867 B2 * | 8/2022 | Lim | H01L 29/7869 |
| 11,817,462 B2 * | 11/2023 | Gong | H01L 29/41733 |
| 2020/0258952 A1 | 8/2020 | Bok et al. | |

FOREIGN PATENT DOCUMENTS

| | | |
|---|---|---|
| KR | 10-2020-0077477 A | 6/2020 |
| KR | 10-2020-0098742 A | 8/2020 |

\* cited by examiner

DISPLAY DEVICE

CROSS-REFERENCE TO RELATED APPLICATION

This application is based on and claims priority under 35 U.S.C. § 119 to Korean Patent Application No. 10-2020-0159083, filed on Nov. 24, 2020, in the Korean Intellectual Property Office, the disclosure of which is incorporated by reference herein in its entirety.

BACKGROUND

1. Field

One or more embodiments relate to a display device.

2. Description of the Related Art

Mobile electronic apparatuses are widely used. As mobile electronic apparatuses, not only small electronic apparatuses such as mobile phones but also tablet personal computers (PCs) have been widely used in recent years. Such mobile electronic apparatuses include display devices to provide various functions, for example, to provide visual information such as images or videos to users.

Recently, as other parts for driving display devices are miniaturized, the proportion of display devices in electronic apparatuses has gradually been increasing. There is an increasing need for high-resolution display devices. Therefore, studies have been actively conducted to solve the problems of high integration and power consumption of display devices. As display devices are used in various ways, the number of functions that may be added or linked to display devices is increasing.

SUMMARY

According to one or more embodiments, a display device includes a first display area in which a plurality of first light-emitting elements are arranged, a second display area in which a plurality of second light-emitting elements are arranged, the second area including a transmission area, a third display area in which a plurality of third light-emitting elements are arranged, the third display area being between the first display area and the second display area, and a plurality of pixel circuits in the third display area and electrically connected to the plurality of third light-emitting elements, respectively, wherein each of the plurality of pixel circuits includes a first thin-film transistor including a first semiconductor layer and a first gate electrode overlapping at least a portion of the first semiconductor layer, a second thin-film transistor including a second semiconductor layer including a material different from that of the first semiconductor layer and a second gate electrode overlapping at least a portion of the second semiconductor layer, and a bottom shielding layer below the second semiconductor layer and overlapping at least a portion of the second semiconductor layer on a plane.

According to the present embodiment, the first semiconductor layer of the first thin-film transistor may include a silicon semiconductor material, and the second semiconductor layer of the second thin-film transistor may include an oxide semiconductor material.

According to the present embodiment, the display device may further include a wiring layer including a same material as that of the second gate electrode of the second thin-film transistor, wherein the wiring layer may be electrically connected to the bottom shielding layer through a contact hole in the third display area.

According to the present embodiment, each of the plurality of pixel circuits may further include a capacitor electrode overlapping at least a portion of the first gate electrode of the first thin-film transistor, and the bottom shielding layer may include a same material as that of the capacitor electrode.

According to the present embodiment, the bottom shielding layer may include a same material as that of the first gate electrode of the first thin-film transistor.

According to the present embodiment, the bottom shielding layer may include a same material as that of the first semiconductor layer of the first thin-film transistor.

According to the present embodiment, the display device may further include a bottom metal layer below the first semiconductor layer of the first thin-film transistor and overlapping the first semiconductor layer on a plane.

According to the present embodiment, the display device may further include a light shielding portion in the third display area and including two conductive layers.

According to the present embodiment, the light shielding portion may be closer to the second display area than the plurality of pixel circuits on a plane.

According to the present embodiment, the light shielding portion may be arranged to surround at least a portion of the second display area on a plane.

According to the present embodiment, the at least two conductive layers of the light shielding portion may include a first conductive layer including a same material as that of the first gate electrode or the second gate electrode, and a second conductive layer on the first conductive layer and electrically connected to the first conductive layer.

According to the present embodiment, the display device may further include a bottom metal layer below the first semiconductor layer of the first thin-film transistor and overlapping the first semiconductor layer on a plane, wherein the at least two conductive layers of the light shielding portion may further include a third conductive layer including a same material as that of the bottom metal layer and electrically connected to the first conductive layer.

According to the present embodiment, each of the plurality of third light-emitting elements may include a pixel electrode, an opposite electrode on the pixel electrode, and an intermediate layer between the pixel electrode and the opposite electrode, and the pixel electrode may overlap the second thin-film transistor of each of the plurality of pixel circuits on a plane.

According to one or more embodiments, a display device includes a first display area in which a plurality of first light-emitting elements are arranged, a second display area in which a plurality of second light-emitting elements are arranged, the second area including a transmission area that allows transmitted light to pass the second light emitting elements, a third display area in which a plurality of third light-emitting elements are arranged, the third display area being between the first display area and the second display area, and a plurality of pixel circuits in the third display area and electrically connected to the plurality of third light-emitting elements, respectively, wherein each of the plurality of pixel circuits includes a first thin-film transistor including a first semiconductor layer and a first gate electrode overlapping at least a portion of the first semiconductor layer, a second thin-film transistor including a second semiconductor layer including a material different from that of the first semiconductor layer and a second gate electrode overlapping at least a portion of the second semiconductor layer, and a bottom shielding layer below the second semiconductor layer and overlapping at least a portion of the second semiconductor layer on a plane, wherein the transmitted light or reflected light is blocked from illuminating the second semiconductor layer by the bottom shielding layer.

According to the present embodiment, the display device may include a bottom metal layer below the first semiconductor layer on a plane.

According to the present embodiment, the display device may include a light shielding portion in the third display area and comprising two conductive layers.

According to one or more embodiments, a display device includes a substrate including a first area, a second area, and a third area between the first area and the second area, a first semiconductor layer on the substrate in the third area and including a silicon semiconductor material, a first insulating layer covering the first semiconductor layer, a first gate electrode on the first insulating layer and overlapping at least a portion of the first semiconductor layer, a second insulating layer covering the first gate electrode, a second semiconductor layer on the second insulating layer in the third area and including an oxide semiconductor material, a third insulating layer covering the second semiconductor layer, a second gate electrode on the third insulating layer and overlapping at least a portion of the second semiconductor layer, and a bottom shielding layer between the substrate and the second semiconductor layer and overlapping at least a portion of the second semiconductor layer on a plane, wherein each of the first to third insulating layers includes a hole overlapping a portion of the second area.

According to the present embodiment, the display device may further include a wiring layer on the third insulating layer and including a same material as that of the second gate electrode, wherein the bottom shielding layer may be electrically connected to the wiring layer through a contact hole in the third area.

According to the present embodiment, the bottom shielding layer may include a same material as that of the first gate electrode or the first semiconductor layer.

According to the present embodiment, the display device may further include a bottom metal layer between the substrate and the first semiconductor layer and overlapping the first semiconductor layer on a plane.

According to the present embodiment, the display device may further include a fourth insulating layer covering the second gate electrode, and a light shielding portion in the third area, wherein the light shielding portion may include a first conductive layer on a same layer as the first gate electrode or the second gate electrode, and a second conductive layer on the fourth insulating layer and having a portion electrically connected to the first conductive layer through a contact hole in the fourth insulating layer.

According to the present embodiment, the light shielding portion may be closer to the second area than a region of the third area in which the second semiconductor layer is arranged, on a plane.

According to the present embodiment, the light shielding portion may be arranged to surround at least a portion of the second area on a plane.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
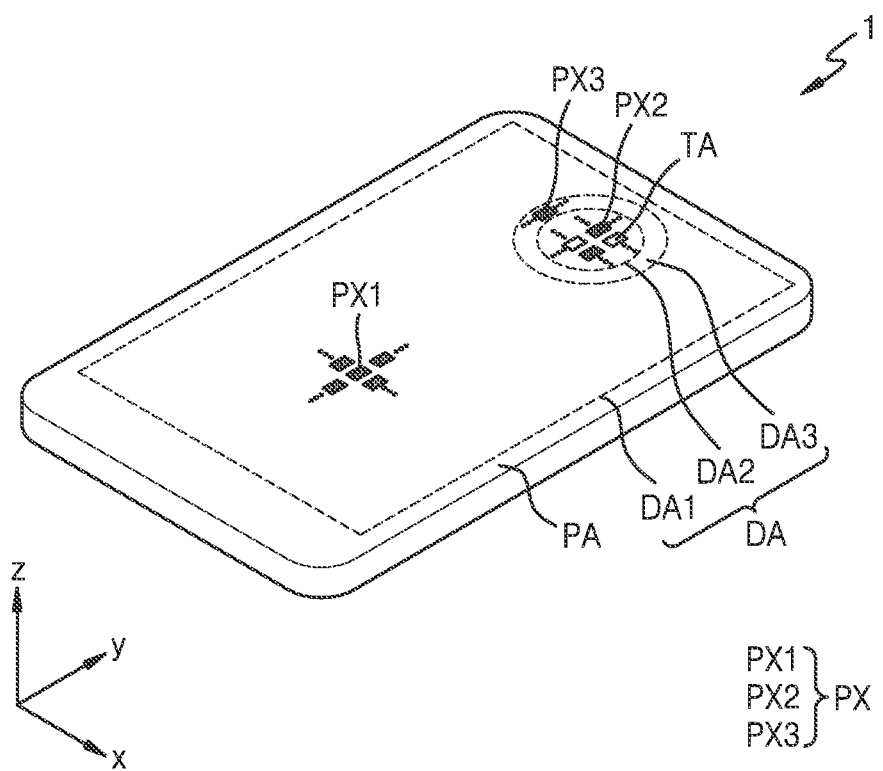
FIG. 1 is a schematic perspective view of an electronic apparatus including a display device, according to an embodiment.

Reference will now be made in detail to embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

The embodiments of the disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the each of the terms "comprises," comprising," "includes," and "including" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. For example, because sizes and thicknesses of elements in the drawings are arbitrarily illustrated for convenience of explanation, the present disclosure is not limited thereto.

When a certain embodiment may be implemented differently, a specific process order may be performed differently from the described order. For example, two consecutively described processes may be performed substantially at the same time or performed in an order opposite to the described order.

In this specification, the expression "A and/or B" indicates only A, only B, or both A and B. The expression "at least one of A and B" indicates only A, only B, or both A and B.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

One or more embodiments include a display device in which power consumption is reduced and a display area is expanded to allow an image to be displayed even in an area in which an electronic component that receives or transmits light is arranged below the light emitting elements. One or more embodiments include a display device in which pixel circuits around an area in which the electronic component is arranged are protected from the reflected or transmitted light, which improves display quality.

FIG. 1 is a schematic perspective view of an electronic apparatus 1 including a display device, according to an embodiment.

Referring to FIG. 1, the electronic apparatus 1 may include a display area DA and a peripheral area PA adjacent to the display area DA. The electronic apparatus 1 may provide an image through an array of a plurality of pixels PX in the display area DA.

The display area DA may include a first display area DA1, a second display area DA2 including a transmission area TA, and a third display area DA3 between the first display area DA1 and the second display area DA2. The pixels PX may include a plurality of first pixels PX1 in the first display area DA1, a plurality of second pixels PX2 in the second display area DA2, and a plurality of third pixels PX3 in the third display area DA3.

According to an embodiment, the array of the first pixels PX1 may be different from the array of the second pixels PX2. For example, because the transmission areas TA are between the second pixels PX2 and/or the transmission areas TA are adjacent to the second pixels PX2, the array of the first pixels PX may be different from the array of the second pixels PX2. According to an embodiment, the array of the first pixels PX1 may be the same as the array of the third pixels PX3.

The electronic apparatus 1 may provide a first image by using light emitted from the first pixels PX1 in the first display area DA1, may provide a second image by using light emitted from the second pixels PX2 in the second display area DA2, and may provide a third image by using light emitted from the third pixels PX3 in the third display area DA3. According to some embodiments, the first to third images may be portions of one image provided through the display area DA of the electronic apparatus 1. Alternatively, according to some embodiments, the electronic apparatus 1 may provide the first to third images that are independent of each other. Alternatively, according to some embodiments, in the display device 1, the first image and the third image may be portions of one image, and the second image may be independent of the one image.

As described above, the second display area DA2 may include the transmission areas TA between the second pixels PX2 and/or adjacent to the second pixels PX2. The transmission area TA is an area through which light may pass, and the pixels PX may not be arranged.

The peripheral area PA is a non-display area that does not provide an image, and may completely or partially surround the display area DA. A driver or the like, which provides an electrical signal or power to the display area DA, may be in the peripheral area PA. A pad, which is an area to which an electronic element or a printed circuit board may be electrically connected, may be in the peripheral area PA.

As illustrated in FIG. 1, the second display area DA2 may have a circular shape or an elliptical shape on a plane. Alternatively, the second display area DA2 may have a polygonal shape such as a rectangular or bar type. The disclosure is not limited to a specific shape on a plane of the second display area DA2.

The second display area DA2 may be inside the first display area DA1 or may be on one side of the first display area DA1. As illustrated in FIG. 1, the second display area DA2 may be completely surrounded by the first display area DA1. According to some embodiments, the second display area DA2 may be partially surrounded by the first display area DA1. For example, the second display area DA2 may be partially surrounded by the first display area DA1 while being positioned at a corner of one side of the first display area DA1.

A ratio of the second display area DA2 to the display area DA may be less than a ratio of the first display area DA1 to the display area DA. The electronic apparatus 1 may include one second display area DA2 as illustrated in FIG. 1, or may include two or more second display areas DA2.

The third display area DA3 may be between the first display area DA1 and the second display area DA2. As illustrated in FIG. 1, the third display area DA3 may completely surround the second display area DA2, and may be completely surrounded by the first display area DA1. According to some embodiments, the third display area DA3 may partially surround the second display area DA2.

As illustrated in FIG. 1, the electronic apparatus 1 may have a rectangular shape with round corners on a plane, but the disclosure is not limited thereto. The electronic apparatus 1 may have various shapes, for example, a polygonal shape, a circular shape, an elliptical shape, and the like.

The electronic apparatus 1 may include a mobile phone, a tablet personal computer (PC), a laptop, a smart watch or a smart band worn on a wrist, an electronic device for a vehicle, and the like.

Figure 2:
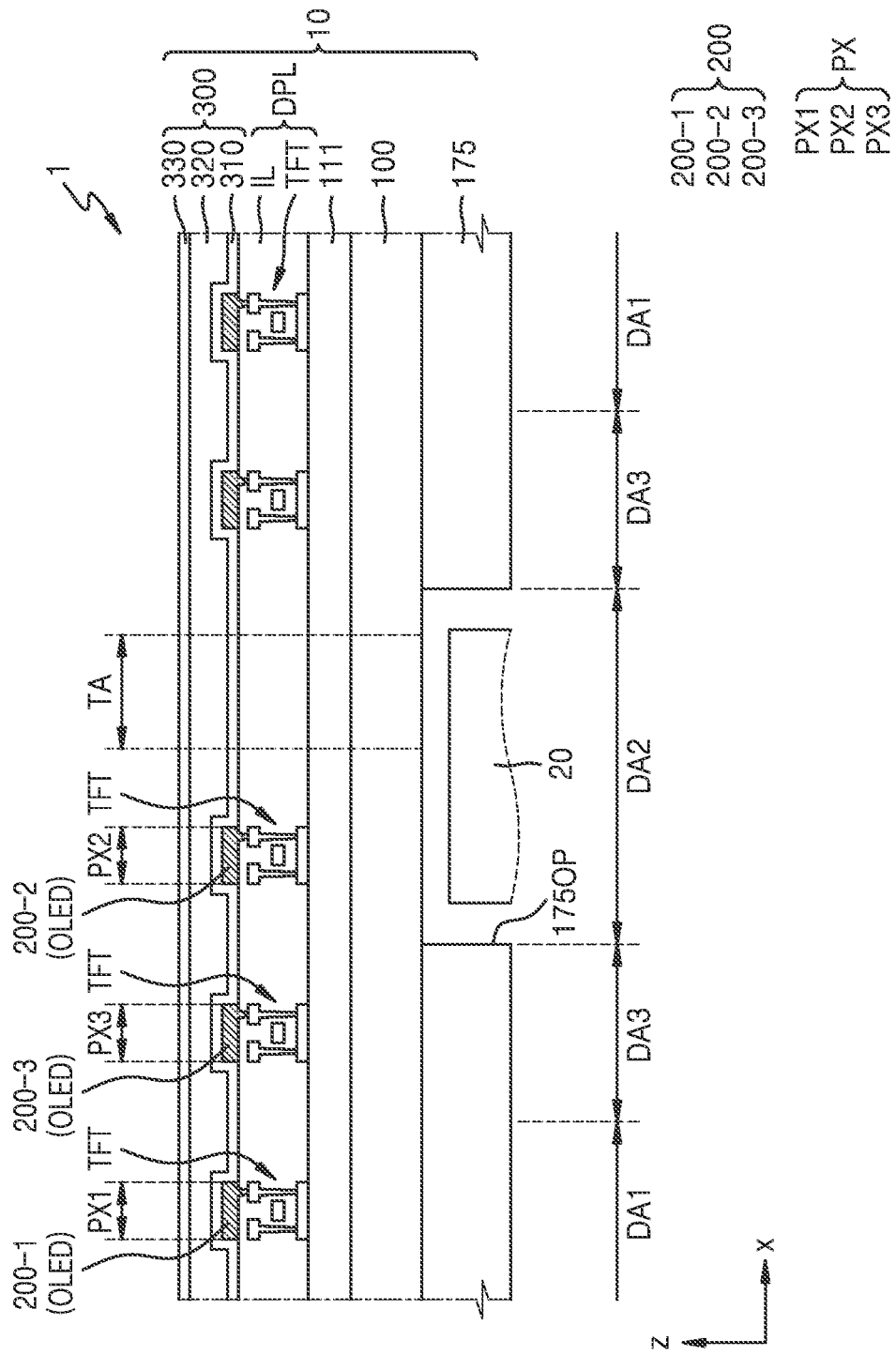
FIG. 2 is a schematic cross-sectional view of a portion of the electronic apparatus according to an embodiment.

FIG. 2 is a schematic cross-sectional view of a portion of an electronic apparatus 1 according to an embodiment.

Referring to FIG. 2, the electronic apparatus 1 may include a display device 10 and an electronic component 20 arranged to overlap the display device 10.

The display device 10 may include a substrate 100, a display layer DPL on the substrate 100, and a thin-film encapsulation layer 300 on the display layer DPL.

The electronic component 20 may be arranged to overlap the second display area DA2. The electronic component 20 may include an electronic element using light or sound. For example, the electronic component may include a sensor (e.g., a proximity sensor) configured to measure a distance, a sensor configured to recognize part of a user's body (e.g., a fingerprint, an iris, a face, etc.), a small lamp configured to output light, and an image sensor (e.g., a camera) configured to capture an image. The electronic element using light may use light of various wavelength bands such as visible light, infrared light, and ultraviolet light. The electronic element using sound may use ultrasonic waves or sound of other frequency bands. According to some embodiments, the electronic component 20 may include sub-components such as a light-emitting part and a light-receiving part. The light-emitting part and the light-receiving part may have an integrated structure, or a pair of the light-emitting part and the light-receiving part may constitute one electronic component 20 in a physically separated structure.

The substrate 100 of the display device 10 may include glass or a polymer resin. The substrate 100 may have a multilayer structure including an inorganic layer (not illustrated) and a layer including the above-described polymer resin.

A buffer layer 111 and the display layer DPL may be on the front surface of the substrate 100, and a lower protective film 175 may be on the rear surface of the substrate 100. The lower protective film 175 may be attached to the rear surface of the substrate 100. An adhesive layer may be between the lower protective film 175 and the substrate 100. Alternatively, the lower protective film 175 may be directly formed on the rear surface of the substrate 100. In this case, no adhesive layer is between the lower protective film 175 and the substrate 100.

The lower protective film 175 may support and protect the substrate 100. The lower protective film 175 may include an opening 175OP corresponding to the second display area DA2. The opening 175OP of the lower protective film 175 is a concave portion formed by removing a portion of the lower protective film 175 in the thickness direction. According to some embodiments, the opening 175OP of the lower protective film 175 may be formed by completely removing a portion of the lower protective film 175 in the thickness direction. In this case, the opening 175OP of the lower protective film 175 may have a through-hole shape as illustrated in FIG. 2. According to some embodiments, the opening 175OP of the lower protective film 175 may be formed by partially removing a portion of the lower protective film 175 in the thickness direction. In this case, the opening 175OP of the lower protective film 175 may have a blind-hole shape.

Because the lower protective film 175 includes the opening 175OP, the transmittance of the second display area DA2, for example, the light transmittance of the transmission area TA may be improved. The lower protective film 175 may include an organic insulating material such as polyethylene terephthalate (PET) or polyimide (PI).

The display layer DPL may include a light-emitting diode as a light-emitting element 200. The light-emitting diode may include, for example, an organic light-emitting diode OLED. Also, the display layer DPL may include a thin-film transistor TFT electrically connected to the light-emitting element 200, and an insulating layer above, below, and/or between layers constituting the thin-film transistor TFT. The light-emitting element 200, for example, the organic light-emitting diode OLED, may emit light of different colors, such as red light, green light, or blue light, according to a type of an organic material included therein. The light-emitting element 200 of the display layer DPL may emit light from an emission area, and the emission area may be defined as a pixel PX. The pixel PX may be defined as an area capable of emitting, for example, red light, green light, or blue light. Because the array of the pixels PX forms the display area DA, the light-emitting elements are in the display area DA.

According to an embodiment, a first light-emitting element 200-1, a second light-emitting element 200-2, and a third light-emitting element 200-3 may be in the first display area DA1, the second display area DA2, and the third display area DA3, respectively. As described above, the first to third light-emitting elements 200-1, 200-2, and 200-3 may be electrically connected to the thin-film transistors, respectively. The emission areas in which the first to third light-emitting elements 200-1, 200-2, and 200-3 emit light may be defined as first to third pixels PX1, PX2, and PX3. According to some embodiments, the thin-film transistor electrically connected to the second light-emitting element 200-2 may be in the first display area DA1, the third display area DA3, and/or the peripheral area PA.

The second display area DA2 may include the transmission area TA in which the thin-film transistor TFT and the organic light-emitting diode OLED are not arranged. The transmission area TA is an area through which light emitted from the electronic component 20 and/or directed to the electronic component 20 may be transmitted. In the display device 10, the transmittance of the transmission area TA may be about 30% or more, about 40% or more, about 50% or more, about 60% or more, about 75% or more, or about 80% or more, or about 85% or more, or about 90% or more.

The display layer DPL may be sealed with a sealing member. According to some embodiments, the encapsulation member may include a thin-film encapsulation layer 300, as illustrated in FIG. 2. The thin-film encapsulation layer 300 may include at least one inorganic layer and at least one organic layer. According to an embodiment, the thin-film encapsulation layer 300 may include first and second inorganic layers 310 and 330 and an organic layer 320 therebetween. The first and second inorganic layers 310 and 330 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The organic layer 320 may include a polymer-based material. The polymer-based material may include a silicone-based resin, an acrylic resin, an epoxy resin, polyimide, and polyethylene.

One or more electronic components 20 may be in the second display area DA2. When the electronic apparatus 1 includes the electronic components 20, the electronic apparatus 1 may include as many second display areas DA2 as the electronic components 20. For example, the electronic apparatus 1 may include the second display areas DA2 apart from each other. According to some embodiments, the electronic components 20 may be in one second display area DA2. For example, the electronic apparatus 1 may include the bar-type second display area DA2, and the electronic components 20 may be apart from each other in the length direction of the second display area DA2.

According to an embodiment, because the second pixel PX2 is in the second display area DA2, the second display area DA2 may display an image. Also, because the second display area DA2 is an area in which the electronic component 20 is arranged and includes the transmission area TA through which light or signals directed to the electronic component 20 and light or signals from the electronic component 20 may be transmitted, the second display area DA2 may be an area in which the electronic component 20 performs functions. In this manner, the display device 10 in which the display area is expanded to allow an image to be displayed even in the area in which the electronic component 20 is arranged may be implemented.

Although FIG. 2 illustrates that the display device 10 includes the organic light-emitting diode OLED as the light-emitting element 200, the display device 10 according to the disclosure is not limited thereto. According to another embodiment, the display device 10 may include an inorganic light-emitting display such as a micro LED, a quantum dot light-emitting display, or an organic/inorganic composite light-emitting display, and the like. However, for convenience of description, a case in which the display device 10 includes the organic light-emitting diode OLED as the light-emitting element 200 will be described below.

Figure 3:
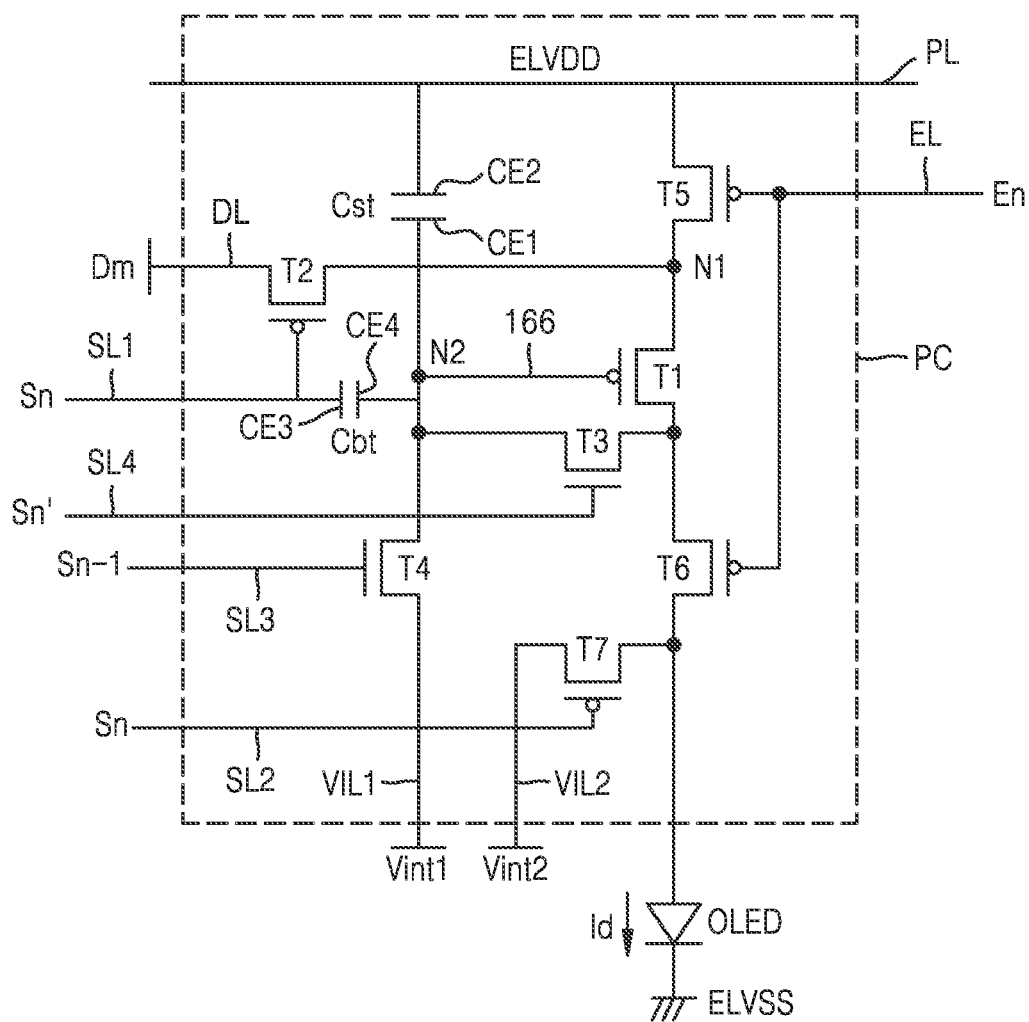
FIG. 3 is an equivalent circuit diagram of a pixel circuit included in the display device, according to an embodiment.

FIG. 3 is an equivalent circuit diagram of a pixel circuit PC included in the display device, according to an embodiment.

Referring to FIG. 3, the pixel circuit PC may include first to seventh thin-film transistors T1, T2, T3, T4, T5, T6, and T7, a first capacitor Cst, and a second capacitor Cbt. Also, the pixel circuit PC may be connected to a plurality of signal lines, first and second initialization voltage lines VIL1 and VIL2, and a power supply voltage line PL. The signal lines may include a data line DL, a first scan line SL1, a second scan line SL2, a third scan line SL3, a fourth scan line SL4, and an emission control line EL. According to another embodiment, at least one of the signal lines, the first and second initialization voltage lines VIL1 and VIL2, and/or the power supply voltage line PL may be shared by neighboring pixel circuits.

The power supply voltage line PL may be configured to transmit a driving voltage ELVDD to the first thin-film transistor T1. The first initialization voltage line VIL1 may be configured to transmit, to the pixel circuit PC, a first initialization voltage Vint1 for initializing the first thin-film transistor T1. The second initialization voltage line VIL2 may be configured to transmit, to the pixel circuit PC, a second initialization voltage Vint2 for initializing the organic light-emitting diode OLED.

For example, FIG. 3 illustrates that the third thin-film transistor T3 and the fourth thin-film transistor T4 among the first to seventh thin-film transistors T1 to T7 are implemented as n-channel metal-oxide semiconductor field effect transistor (MOSFET) (NMOS), and the others are implemented as p-channel MOSFET (PMOS).

The first thin-film transistor T1 may be connected to the power supply voltage line PL via the fifth thin-film transistor T5 and electrically connected to the organic light-emitting diode OLED via the sixth thin-film transistor T6. The first thin-film transistor T1, which is a driving thin-film transistor, may receive a data signal Dm according to the switching operation of the second thin-film transistor T2 and supply a driving current Id to the organic light-emitting diode OLED.

The second thin-film transistor T2, which is a switching thin-film transistor, may be connected to the first scan line SL1 and the data line DL and connected to the power supply voltage line PL via the fifth thin-film transistor T5. The second thin-film transistor T2 may be turned on in response to a first scan signal Sn received through the first scan line SL1 and perform a switching operation to transmit, to a first node N1, the data signal Dm transmitted to the data line DL.

The third thin-film transistor T3, which is a compensation thin-film transistor, may be connected to the fourth scan line SL4 and connected to the organic light-emitting diode OLED via the sixth thin-film transistor T6. The third thin-film transistor T3 may be turned on in response to a fourth scan signal Sn' received through the fourth scan line SL4 and diode-connect the first thin-film transistor T1.

The fourth thin-film transistor T4, which is a first initialization thin-film transistor, may be connected to the third scan line SL3, which is a previous scan line, and the first initialization voltage line VIL1 and may be turned on in response to a third scan signal Sn−1, which is a previous scan signal received through the third scan line SL3, and initialize a voltage of a gate electrode of the first thin-film transistor T1 by transmitting the first initialization voltage Vint1 from the first initialization voltage line VIL1 to the gate electrode of the first thin-film transistor T1.

The fifth thin-film transistor T5 may serve as an operation control thin-film transistor, and the sixth thin-film transistor T6 may serve as an emission control thin-film transistor. The fifth thin-film transistor T5 and the sixth thin-film transistor T6 may be connected to the emission control line EL and may be simultaneously turned on in response to an emission control signal En received through the emission control line EL to form a current path so that the driving current Id flows from the power supply voltage line PL to the organic light-emitting diode OLED.

The seventh thin-film transistor T7, which is a second initialization thin-film transistor, may be connected to the second scan line SL2, which is a next scan line, and the second initialization voltage line VIL2, and may be turned on in response to a second scan signal Sn+1, which is a next scan signal received through the second scan line SL2, and initialize the organic light-emitting diode OLED by transmitting the second initialization voltage Vint2 from the second initialization voltage line VIL2 to the organic light-emitting diode OLED. According to some embodiments, the seventh thin-film transistor T7 may be omitted.

The first capacitor Cst may include a first electrode CE1 and a second electrode CE2. The first electrode CE1 may be connected to the gate electrode of the first thin-film transistor T1, and the second electrode CE2 may be connected to the power supply voltage line PL. The first capacitor Cst may store and maintain a voltage corresponding to a difference between the voltage of the power supply voltage line PL and the voltage of the gate electrode of the first thin-film transistor T1, so that the voltage applied to the gate electrode of the first thin-film transistor T1 is maintained.

The second capacitor Cbt may include a third electrode CE3 and a fourth electrode CE4. The third electrode CE3 may be connected to the first scan line SL1 and a gate electrode of the second thin-film transistor T2. The fourth electrode CE4 may be connected to the gate electrode of the first thin-film transistor T1 and the first electrode CE1 of the first capacitor Cst. The second capacitor Cbt is a boosting capacitor. When the first scan signal Sn of the first scan line SL1 is a voltage for turning off the second thin-film transistor T2, the second capacitor Cbt may increase the voltage of the second node N2 so that a voltage (black voltage) displaying black is reduced.

The organic light-emitting diode OLED may include a pixel electrode and an opposite electrode, and the opposite electrode may receive a common power supply voltage ELVSS. The organic light-emitting diode OLED receives the driving current Id from the first thin-film transistor T1 and emits light to display an image.

A specific operation of each pixel circuit PC according to an embodiment is as follows.

During a first initialization period, when the third scan signal Sn−1 is supplied through the third scan line SL3, the fourth thin-film transistor T4 may be turned on in response to the third scan signal Sn−1, and the first thin-film transistor T1 may be initialized by the first initialization voltage Vint1 supplied from the first initialization voltage line VIL1.

During a data programming period, when the first scan signal Sn and the fourth scan signal Sn' are respectively supplied through the first scan line SL1 and the fourth scan line SL4, the second thin-film transistor T2 and the third thin-film transistor T3 may be turned on in response to the first scan signal Sn and the fourth scan signal Sn'. At this time, the first thin-film transistor T1 may be diode-connected by the turned-on third thin-film transistor T3 and biased in the forward direction. A voltage, in which a threshold voltage (Vth) of the first thin-film transistor T1 is compensated in the data signal Dm supplied from the data line DL, may be applied to the gate electrode of the first thin-film transistor T1. The driving voltage ELVDD and the compensation voltage may be applied to both ends of the first capacitor Cst, and an electric charge corresponding to a voltage difference between both ends of the first capacitor Cst may be stored in the first capacitor Cst.

During an emission period, the fifth thin-film transistor T5 and the sixth thin-film transistor T6 may be turned on in response to the emission control signal En supplied from the emission control line EL. The driving current Id may be generated according to the difference between the voltage of the gate electrode of the first thin-film transistor T1 and the voltage of the driving voltage ELVDD, and the driving current Id may be supplied to the organic light-emitting diode OLED through the sixth thin-film transistor T6.

During a second initialization period, when the second scan signal Sn+1 is supplied through the second scan line SL2, the seventh thin-film transistor T7 may be turned on in response to the second scan signal Sn+1, and the organic light-emitting diode OLED may be initialized by the second initialization voltage Vint2 supplied from the second initialization voltage line VIL2.

According to an embodiment, the thin-film transistors T1 to T7 may include silicon-based thin-film transistors including a silicon semiconductor. According to another embodiment, at least one of the thin-film transistors T1 to T7 may include oxide-based thin-film transistors including an oxide semiconductor, and the others thereof may include silicon-based thin-film transistors including a silicon semiconductor.

Specifically, the first thin-film transistor T1 that directly influences the brightness of the display device 10 (see FIG. 1) may including a silicon-based thin-film transistor including a silicon semiconductor layer including polycrystalline silicon with high reliability. In this manner, a high-resolution display device may be implemented.

Because the oxide semiconductor has high carrier mobility and low leakage current, the voltage drop is not great even though the driving time is long. That is, even during low-frequency driving, the color change of the image according to the voltage drop is not great, and thus, low-frequency driving is possible. As such, the oxide semiconductor has the advantage of less leakage current. Therefore, at least one of the third thin-film transistor T3 and the fourth thin-film transistor T4, which are connected to the gate electrode of the first thin-film transistor T1, may include an oxide semiconductor and may prevent leakage current that may flow to the gate electrode of the first thin-film transistor T1 and reduce power consumption.

According to an embodiment, the pixel circuit PC located in the first display area DA1 having the greatest area ratio in the display area DA may include the thin-film transistors T1 to T7, at least one of the thin-film transistors T1 to T7 may be an oxide thin-film transistor, and the others thereof may be silicon thin-film transistors. Specifically, the first thin-film transistor T1, the second thin-film transistor T2, and the fifth to seventh thin-film transistors T5, T6, and T7 in the first display area DA1 may be silicon-based thin-film transistors, and the third and fourth thin-film transistors T3 and T4 in the first display area DA1 may be oxide-based thin-film transistors. Also, the pixel circuit PC in the third display area DA3 adjacent to the first display area DA1 may have the same configuration as that of the pixel circuit PC in the first display area DA1. Therefore, the display device 10 that implements high resolution, prevents leakage current, and reduces power consumption may be provided.

According to an alternative embodiment, as described above, at least one of the thin-film transistors T1 to T7 of the pixel circuit PC in the second display area DA2 may be an oxide-based thin-film transistor, and the others thereof may be silicon-based thin-film transistors. Alternatively, all the thin-film transistors T1 to T7 in the second display area DA2 may be silicon-based thin-film transistors. Hereinafter, for convenience of description, a case in which all the thin-film transistors T1 to T7 of the pixel circuit PC in the second display area DA2 are silicon-based thin-film transistors will be described.

Figure 4:
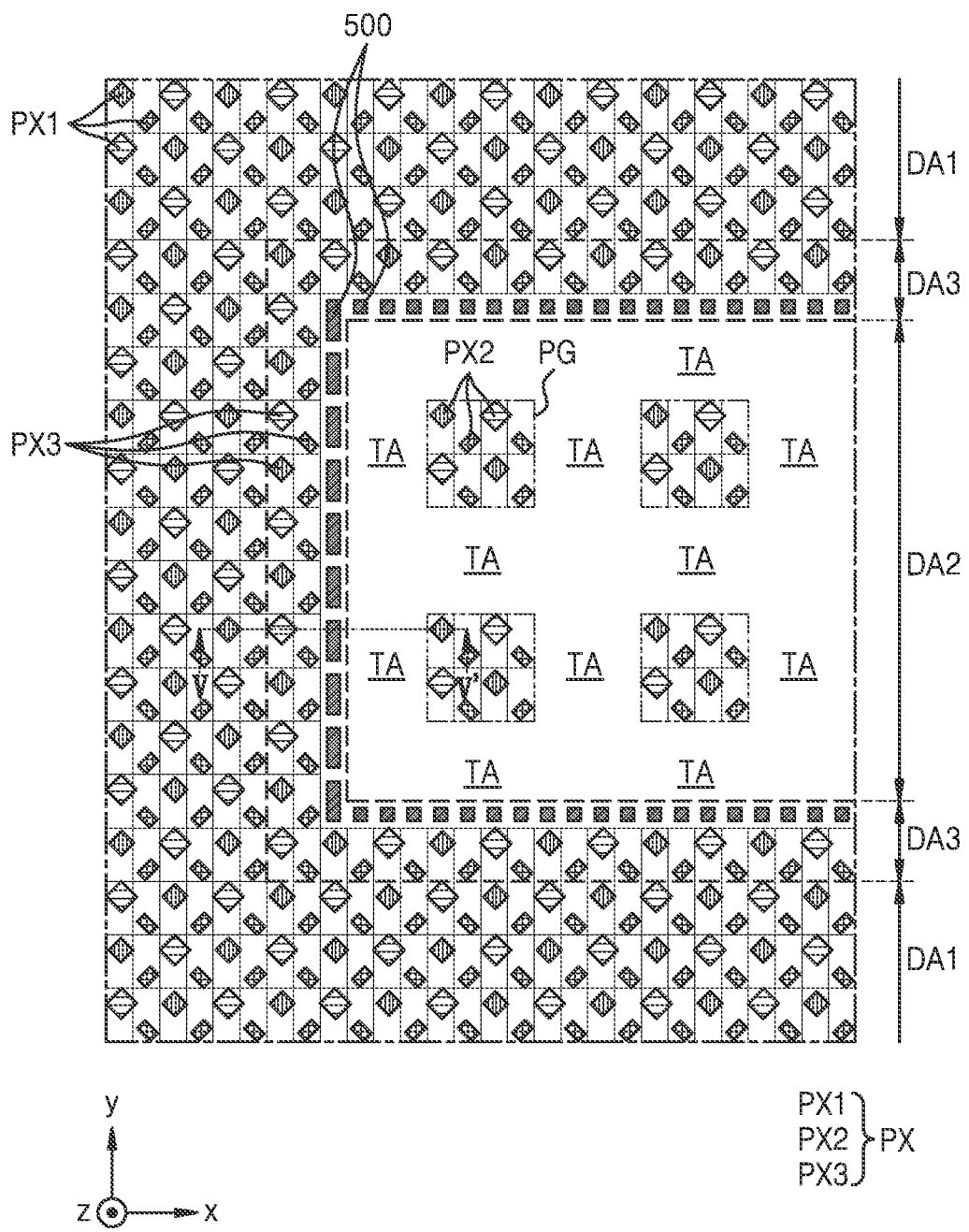
FIG. 4 is a plan view schematically illustrating the arrangement of pixels in a display device, according to an embodiment.

FIG. 4 is a plan view schematically illustrating the arrangement of pixels of a display device, according to an embodiment.

Referring to FIG. 4, a plurality of first pixels PX1 may be in a first display area DA1. The first pixels PX1 may include, for example, a first red pixel, a first green pixel, and a first blue pixel. The first red pixel, the first green pixel, and the first blue pixel may have different sizes (i.e., areas) from each other. Although FIG. 4 illustrates that the first pixels PX1 are arranged in a PENTILE® matrix, the disclosure is not limited thereto and the first pixels PX1 may be arranged in various types such as a stripe type.

A plurality of second pixels PX2 may be in a second display area DA2. The second pixels PX2 may include, for example, a second red pixel, a second green pixel, and a second blue pixel. The second red pixel, the second green pixel, and the second blue pixel may have different sizes (i.e., areas) from each other.

The second display area DA2 may include a transmission area TA and a pixel group PG including at least one second pixel PX2. According to an embodiment, as illustrated in FIG. 4, transmission areas TA may be between pixel groups PG adjacent to each other. According to another embodiment, the pixel groups PG and the transmission areas TA may be alternately arranged in the x direction and the y direction. For example, the pixel groups PG and the transmission areas TA may be arranged in a grid shape. According to another embodiment, the transmission areas TA may completely surround the pixel groups PG adjacent to each other. As such, the disclosure is not limited to a specific arrangement of the pixel groups PG and the transmission areas TA. The pixel groups PG and the transmission areas TA may be variously designed according to various purposes.

The pixel group PG may be defined as a pixel aggregate in which the second pixels PX2 are grouped in a preset unit. For example, as illustrated in FIG. 4, one pixel group PG may include eight second pixels PX2 arranged in a pentile structure. For example, one pixel group PG may include two second red pixels, four second green pixels, and two second blue pixels. Of course, the disclosure is not necessarily limited thereto, and the number of second pixels PX2 included in the pixel group PG may be modified and designed according to the resolution of the second display area DA2.

The transmission area TA is an area through which light is transmitted, and no second pixel PX2 may be in the transmission area TA. Also, the pixel circuit PC (see FIG. 3) and various signal lines electrically connected to the pixel circuit PC may not be in the transmission area TA.

Because the second display area DA2 includes the transmission area TA, the number of first pixels PX1 in the first display area DA1 per the same area may be greater than the number of second pixels PX2 in the second display area DA2, as illustrated in FIG. 4. That is, the resolution in the first display area DA1 may be higher than the resolution in the second display area DA2.

A plurality of third pixels PX3 may be in the third display area DA3. The third pixels PX3 may include, for example, a third red pixel, a third green pixel, and a third blue pixel. The third red pixel, the third green pixel, and the third blue pixel may have different sizes (i.e., areas) from each other. The arrangement of the third pixels PX3 may be the same as the arrangement of the first pixels PX1. For example, as illustrated in FIG. 4, when the first pixels PX1 are arranged in a pentile type, the third pixels PX3 may also be arranged in a pentile type.

As described above, the third display area DA3 may be between the first display area DA1 and the second display area DA2, and may be adjacent to the first display area DA1 and the second display area DA2. Therefore, the third pixels PX3 may be adjacent not only to the first pixels PX1, but also to the transmission areas TA of the second display area DA2.

According to an embodiment, a light shielding portion 500 may be in the third display area DA3. The light shielding portion 500 may be between the transmission area TA of the second display area DA2 and the third pixel PX3 of the third display area DA3 on a plane. In other words, the light shielding portion 500 may be closer to the transmission area TA than the third pixel PX3.

The light shielding portion 500 may be arranged to surround at least a portion of the second display area DA2 on a plane. The expression "on a plane" may mean "in a virtual plane when one surface of the substrate 100 (see FIG. 2) of the display device 10 is viewed vertically." According to an embodiment, as illustrated in FIG. 4, a plurality of light shielding portions 500 may be provided, may be formed in an island shape or an isolated shape on a plane, and may be apart from each other. The light shielding portions 500 may be arranged along a boundary between the second display area DA2 and the third display area DA3 (i.e., an edge of the second display area). In this manner, the light shielding portions 500 may surround at least a portion of the second display area DA2. According to another embodiment, the light shielding portion 500 may be integrally formed. In this case, the light shielding portion 500 may extend along the edge of the second display area DA2 and surround at least a portion of the second display area DA2.

Hereinafter, the structure and function of the light shielding portion 500 will be additionally described in detail with reference to FIG. 5.

Figure 5:
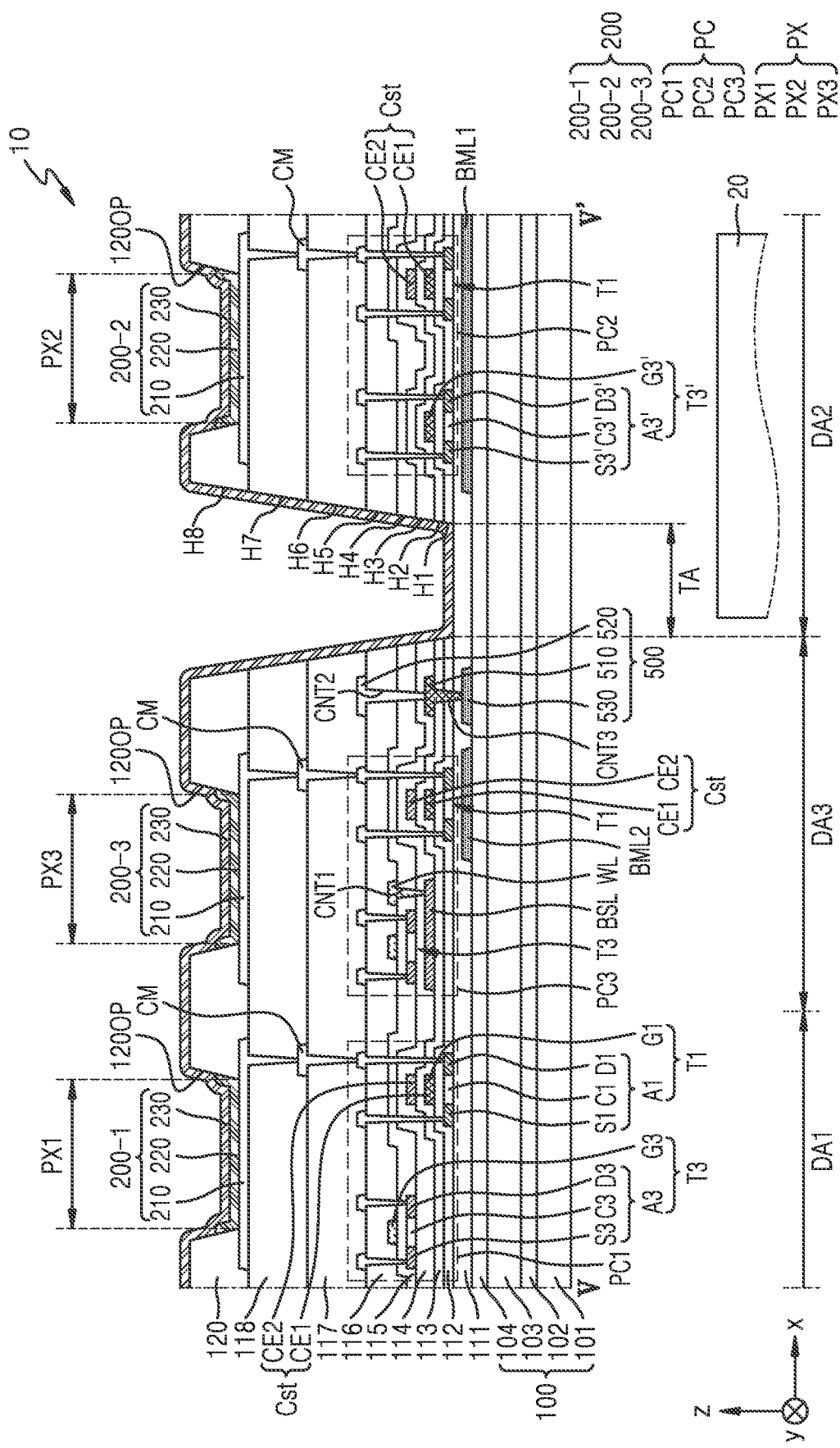
FIG. 5 is a schematic cross-sectional view of a portion of the display device according to an embodiment.

FIG. 5 is a schematic cross-sectional view of a portion of a display device 10 according to an embodiment, and corresponds to a cross-sectional view of the display device 10 taken along line V-V' of FIG. 4.

Referring to FIG. 5, the display device 10 may include a substrate 100 having a first area, a second area, and a third area between the first area and the second area. The first to third areas of the substrate 100 correspond to the first to third display areas DA1, DA2, and DA3 of the display device 10, respectively. The substrate 100 may include glass or a polymer resin. For example, the substrate 100 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). When the substrate 100 includes a polymer resin, the substrate 100 may be flexible or bendable.

The substrate 100 may have a single-layer structure or a multilayer structure including the above-described material. When the substrate 100 has a multilayer structure, the substrate 100 may further include an inorganic layer. For example, the substrate 100 may include a first base layer 101, a first barrier layer 102, a second base layer 103, and a second barrier layer 104, which are sequentially stacked. Each of the first base layer 101 and the second base layer 103 may include the above-described polymer resin. The first barrier layer 102 and the second barrier layer 104 prevent infiltration of an external foreign matter, and may include a single layer or multiple layers including an inorganic material such as silicon nitride (SiN) or silicon oxide ($SiO_x$).

A buffer layer 111 may be on the substrate 100. The buffer layer 111 may increase the smoothness of the upper surface of the substrate 110. The buffer layer 111 may include an oxide layer such as silicon oxide ($SiO_x$), and/or a nitride layer such as silicon nitride ($SiN_x$), or silicon oxynitride ($SiO_xN_y$).

A plurality of pixel circuits PC may be on the buffer layer 111. The pixel circuits PC may include a plurality of first pixel circuits PC1 in the first display area DA1, a plurality of second pixel circuits PC2 in the second display area DA2, and a plurality of third pixel circuits PC3 in the third display area DA3. The first to third pixel circuits PC1, PC2, and PC3 may be electrically connected to first to third light-emitting elements 200-1, 200-2, and 200-3 to be described later, respectively. According to an embodiment, each of the first to third pixel circuits PC1, PC2, and PC3 may include a plurality of thin-film transistors T1, T2, T3, T4, T5, T6, and T7 (FIG. 3). For convenience, only the first thin-film transistor T1 and the third thin-film transistors T3 and T3' are illustrated in FIG. 5.

For convenience of description, the stack structure of the display device 10 will be described focusing on the first display area DA1.

A silicon semiconductor layer including a silicon semiconductor material may be on the buffer layer 111. FIG. 5 illustrates a first semiconductor layer A1 of the first thin-film transistor T1 as the silicon semiconductor layer. The first semiconductor layer A1 may include a first channel region C1, and a first source region S1 and a first drain region D1 on both sides of the first channel region C1. For example, the source region and the drain region may be doped with impurities, and the impurities may include N-type impurities or P-type impurities. The channel region may overlap a gate electrode to be described later, and may not be doped with impurities or may include a very small amount of impurities. The source region and the drain region may correspond to a source electrode and a drain electrode of the thin-film transistor, respectively. The source region and the drain region may be changed with each other according to characteristics of the thin-film transistor. Hereinafter, for convenience, the terms "source region" and "drain region" are used instead of the "source electrode" or the "drain electrode."

A first gate insulating layer 112 may be on the first semiconductor layer A1. The first gate insulating layer 112 may include an inorganic material including an oxide or a nitride. For example, the first gate insulating layer 112 may include at least one selected from silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO).

A first gate electrode G1 may be on the first gate insulating layer 112. The first gate electrode G1 may at least partially overlap the first semiconductor layer A1. For example, the first gate electrode G1 may overlap the first channel region C1 of the first semiconductor layer A1. The first gate electrode G1 of the first thin-film transistor T1 may include, for example, a low-resistance conductive material such as molybdenum (Mo), aluminum (Al), copper (Cu), and/or titanium (Ti), and may include a single-layer structure or a multi-layer structure including the above-described material.

A first capacitor Cst may include a first electrode CE1 and a second electrode CE2. According to an embodiment, the first capacitor Cst may overlap the first thin-film transistor T1. In this case, the first gate electrode G1 may simultaneously function as the gate electrode of the first thin-film transistor T1 and the first electrode CE1. That is, the first gate electrode G1 may be integral with the first electrode CE1. The first electrode CE1 may be formed as an island-shaped electrode. According to another embodiment, the first capacitor Cst may not overlap the first thin-film transistor T1 and may be present at a separate location.

A second gate insulating layer 113 may be on the first gate electrode G1. The second gate insulating layer 113 may include an inorganic material including an oxide or a nitride. For example, the second gate insulating layer 113 may include at least one selected from silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO).

The second electrode CE2 of the first capacitor Cst may be arranged to overlap the first electrode CE1. In this case, the second gate insulating layer 113 may be between the first electrode CE1 and the second electrode CE2, and the second gate insulating layer 113 may serve as a dielectric layer of the first capacitor Cst. Storage capacitance may be determined by an electric charge accumulated in the first capacitor Cst and a voltage between the first and second electrodes CE1 and CE2.

The second electrode CE2 of the first capacitor Cst may include a metal, an alloy, a conductive metal oxide, a transparent conductive material, or the like. The second electrode CE2 may include, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may include a single layer or multiple layers including the above-described material.

A first interlayer insulating layer 114 may be on the second electrode CE2 of the first capacitor Cst. The first interlayer insulating layer 114 may include an inorganic material including an oxide or a nitride. For example, the first interlayer insulating layer 114 may include at least one selected from silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO).

An oxide-based semiconductor layer including an oxide semiconductor may be on the first interlayer insulating layer 114. The oxide-based semiconductor layer may include Zn oxide, In—Zn oxide, Ga—In—Zn oxide, and the like as a Zn oxide-based material. According to some embodiments, the oxide-based semiconductor layer may include In—Ga—Zn—O (IGZO), In—Sn—Zn—O (ITZO), or In—Ga—Sn—Zn—O (IGTZO) semiconductor, in which a metal such as indium (In), gallium (Ga), and tin (Sn) is included in ZnO. FIG. 5 illustrates a third semiconductor layer A3 of the third thin-film transistor T3 as the oxide-based semiconductor layer. The third semiconductor layer A3 may include a third channel region C3, and a third source region S3 and a third drain region D3 on both sides of the third channel region C3.

A third gate insulating layer 115 may be on the third semiconductor layer A3 of the third thin-film transistor T3. The third gate insulating layer 115 may include an inorganic material including an oxide or a nitride. For example, the third gate insulating layer 115 may include at least one selected from silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO).

A third gate electrode G3 of the third thin-film transistor T3 may be on the third gate insulating layer 115. The third gate electrode G3 may overlap at least a portion of the third semiconductor layer A3 of the third thin-film transistor T3. For example, the third gate electrode G3 may overlap the third channel region C3 of the third semiconductor layer A3. The third gate electrode G3 may include, for example, a low-resistance conductive material such as molybdenum (Mo), aluminum (Al), copper (Cu), and/or titanium (Ti), and may include a single-layer structure or a multi-layer structure including the above-described material.

A second interlayer insulating layer 116 may be on the third gate electrode G3 of the third thin-film transistor T3. The second interlayer insulating layer 116 may cover the third thin-film transistors T3 of the first pixel circuit PC1 and the third pixel circuit PC3. The second interlayer insulating layer 116 may include an inorganic material including an oxide or a nitride. For example, the second interlayer insulating layer 116 may include at least one selected from silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO).

A first planarization layer 117 and a second planarization layer 118 may be on the second interlayer insulating layer 116. The first planarization layer 117 and the second planarization layer 118 may include an organic material such as acryl, benzocyclobutene (BCB), polyimide, and hexamethyldisiloxane (HMDSO). Alternatively, the first planarization layer 117 and the second planarization layer 118 may include an inorganic material. The first planarization layer 117 and the second planarization layer 118 serve as a protective layer covering the pixel circuit PC, and the upper surfaces of the first planarization layer 117 and the second planarization layer 118 are planarized. The first planarization layer 117 and the second planarization layer 118 may include a single layer or multiple layers.

A plurality of pixel electrodes 210 may be on the second planarization layer 118. The pixel electrode 210 may include a light-transmitting conductive layer including a light-transmitting conductive oxide such as ITO, $In_2O_3$, or IZO, and a reflective layer including a metal such as Al or Ag. For example, the pixel electrode 210 may have a three-layer structure of ITO/Ag/ITO.

A pixel defining layer 120 may be on the pixel electrode 210. The pixel defining layer 120 may define a pixel PX by having an opening corresponding to each pixel PX, that is, an opening 120OP through which at least the central portion of the pixel electrode 210 is exposed. Also, the pixel defining layer 120 may prevent an electric arc or the like from occurring between the pixel electrode 210 and the opposite electrode 230 by increasing the distance between the edge of the pixel electrode 210 and the opposite electrode 230. The pixel defining layer 120 may include, for example, an organic material such as polyimide or HMDSO.

An intermediate layer 220 may be on the pixel defining layer 120. The intermediate layer 220 may be between the pixel electrode 210 and the opposite electrode 230.

The intermediate layer 220 may include an emission layer formed to correspond to the pixel electrode 210. The emission layer may include an organic light-emitting material such as a high molecular weight organic material or a low molecular weight organic material that emits light of a certain color. Alternatively, the emission layer may include an inorganic emission material or may include quantum dots.

According to an alternative embodiment, functional layers such as a hole transport layer (HTL), a hole injection layer (HIL), an electron transport layer (ETL), and an electron injection layer (EIL) may be further arranged below and above the emission layer. For example, a first functional layer among the functional layers may be an HTL having a single-layer structure and may include poly-(3,4)-ethylenedihydroxy thiophene (PEDOT) or polyaniline (PANI). Alternatively, the first functional layer may include an HIL and an HTL. A second functional layer 223 among the functional layers may include an ETL and/or an EIL.

Although FIG. 5 illustrates an example in which the intermediate layer 220 is formed to correspond to one pixel electrode 210, the disclosure is not limited thereto. As another example, the intermediate layer 220 may be variously modified. For example, the intermediate layer 220 may include an integrated layer over the pixel electrodes 210.

The opposite electrode 230 may be on the intermediate layer 220 and may be arranged to cover the display area DA. That is, the opposite electrode 230 may be integrally formed to cover the pixel electrodes 210. The opposite electrode 230 may extend from the display area DA (see FIG. 1) to the peripheral area PA (see FIG. 1). The opposite electrode 230 may include a conductive material having a low work function. For example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 230 may further include a layer such as ITO, IZO, ZnO, or $In_2O_3$ on the (semi)transparent layer including the above-described material.

The stack structure of the pixel electrode 210, the intermediate layer 220, and the opposite electrode 230 may form an organic light-emitting diode OLED as a light-emitting element 200. An emission area of the light-emitting element 200 may be defined as a pixel PX. Because the opening 120OP of the pixel defining layer 120 defines the size and/or width of the emission area, the size and/or width of the pixel PX may depend on the size and/or width of the corresponding opening 120OP of the pixel defining layer 120.

The display device 10 may include a plurality of light-emitting elements 200. The light-emitting elements 200 may include a plurality of first light-emitting elements 200-1 in the first display area DA1. Each of the first light-emitting elements 200-1 may be electrically connected to the first pixel circuit PC1 located in the first display area DA1 through a contact metal CM located on the first planarization layer 117. An emission area of the first light-emitting element 200-1 may be defined as a first pixel PX1.

Next, the configuration of the display device 10 in the second display area DA2 will be described.

A second pixel circuit PC2 may be on the buffer layer 111. Because the first thin-film transistor T1 of the second pixel circuit PC2 has the same structure as that of the first thin-film transistor T1 of the first pixel circuit PC1 described above, a description thereof will be omitted for brevity.

As described above, the third thin-film transistor T3' of the second pixel circuit PC2 may be provided as a silicon-based thin-film transistor. Therefore, the third thin-film transistor T3' is a silicon semiconductor layer on the buffer layer 111 and may include a third semiconductor layer A3'. The third semiconductor layer A3' may include a channel region C3', and a source region S3' and a drain region D3' on both sides of the channel region C3'.

The third thin-film transistor T3' of the second pixel circuit PC2 may include a third gate electrode G3' overlapping at least a portion of the third semiconductor layer A3'. For example, the third gate electrode G3' may overlap the channel region C3' of the third semiconductor layer A3'. The third gate electrode G3' may be insulated from the third semiconductor layer A3' by the first gate insulating layer 112. The third gate electrode G3' may include, for example, a low-resistance conductive material such as molybdenum (Mo), aluminum (Al), copper (Cu), and/or titanium (Ti), and may include a single-layer structure or a multi-layer structure including the above-described material.

A second gate insulating layer 113, a first interlayer insulating layer 114, a third gate insulating layer 115, a second interlayer insulating layer 116, a first planarization layer 117, and a second planarization layer 118 may be sequentially on the third gate electrode G3' of the third thin-film transistor T3' of the second pixel circuit PC2.

A plurality of second light-emitting elements 200-2 among the light-emitting elements 200 may be in the second display area DA2. The second light-emitting element 200-2 may be electrically connected to the second pixel circuit PC2 through a contact metal CM on the first planarization layer 117. An emission area of the second light-emitting element 200-2 may be defined as a second pixel PX2.

As described above, an electronic component 20 may be in the second display area DA2, and a transmission area TA through which light emitted from the electronic component 20 or directed toward the electronic component 20 is transmitted may be arranged therein. Each of the insulating layers on the substrate 100 may include a hole in the transmission area TA. For example, the first gate insulating layer 112, the second gate insulating layer 113, the first interlayer insulating layer 114, the third gate insulating layer 115, the second interlayer insulating layer 116, the first planarization layer 117, the second planarization layer 118, and the pixel defining layer 120 may include first to eighth holes H1, H2, H3, H4, H5, H6, H7, and H8 positioned in the transmission area TA and overlapping each other, respectively. Therefore, light transmittance in the transmission area TA may be improved.

A first bottom metal layer BML1 may be in the second display area DA2. The first bottom metal layer BML1 may be between the substrate 100 and the second pixel circuit PC2. For example, the first bottom metal layer BML1 may be between the substrate 100 and the first semiconductor layer A1 of the first thin-film transistor T1 of the second pixel circuit PC2. The first bottom metal layer BML1 may include a light-shielding material, and the light-shielding material may include, for example, a metal material such as chromium (Cr) or molybdenum (Mo), a black ink, and/or a dye.

According to an embodiment, the first bottom metal layer BML1 may completely overlap the second pixel circuit PC2. According to another embodiment, the first bottom metal layer BML1 may partially overlap the second pixel circuit PC2. The first bottom metal layer BML1 may overlap at least the first semiconductor layer A1 of the first thin-film transistor T1 of the second pixel circuit PC2. Although not illustrated, the first bottom metal layer BML1 may be electrically connected to the second pixel circuit PC2 and receive a constant voltage. In this manner, the first thin-film transistor T1 of the second pixel circuit PC2 may have stable electrical characteristics.

The first bottom metal layer BML1 may prevent light emitted from the electronic component 20 or directed toward the electronic component 20 from diffracting through a narrow gap between the elements of the second pixel circuit PC2 or the signal lines connected to the second pixel circuit PC2. Therefore, the performance degradation of the electronic component 20 may be significantly reduced. Also, the first bottom metal layer BML1 may prevent light emitted from the electronic component 20 or reflected from the electronic component 20 from being incident onto the second pixel circuit PC2. Therefore, the performance deterioration of the thin-film transistor of the second pixel circuit PC2 due to light may be significantly reduced.

However, the first bottom metal layer BML1 may not overlap the transmission area TA of the second display area DA2 so as not to cause a decrease in the transmittance of light in the transmission area TA.

Next, the configuration of the display device 10 in the third display area DA3 will be described.

A plurality of third light-emitting elements 200-3 among the light-emitting elements 200 may be in the third display area DA3, and a plurality of third pixel circuits PC3 electrically connected to the third light-emitting elements 200-3 may be arranged therein.

The third pixel circuits PC3 may be on the buffer layer 111. As described above, the third pixel circuit PC3 may include a plurality of thin-film transistors T1, T2, T3, T4, T5, T6, and T7. For convenience, only the first thin-film transistor T1 and the third thin-film transistor T3 are illustrated.

The first and third thin-film transistors T1 and T3 of the third pixel circuit PC3 may have the same structures as those of the first and third thin-film transistors T1 and T3 of the first pixel circuit PC1 described above. Therefore, the same reference numerals are assigned to the first thin-film transistors T1 of the first pixel circuit PC1 and the third pixel circuit PC3 Similarly, the same reference numerals are assigned to the third thin-film transistors T3 of the first pixel circuit PC1 and the third pixel circuit PC3. Hereinafter, detailed descriptions of the first and third thin-film transistors T1 and T3 of the third pixel circuit PC3 will be omitted for brevity of description, and will be referred again only when necessary.

According to an embodiment, the third pixel circuit PC3 may include a first thin-film transistor T1 including a first semiconductor layer A1 and a first gate electrode G1 overlapping at least a portion of the first semiconductor layer A1, and a third thin-film transistor T3 including a third semiconductor layer A3 including a material different from that of the first semiconductor layer A1 and a third gate electrode G3 overlapping at least a portion of the third semiconductor layer A3. For example, the first semiconductor layer A1 of the first thin-film transistor T1 of the third pixel circuit PC3 may include a silicon semiconductor material, and the third semiconductor layer A3 of the third thin-film transistor T3 may include an oxide semiconductor material.

According to an embodiment, the third pixel circuit PC3 may include a first capacitor Cst overlapping the first thin-film transistor T1. For example, the first gate electrode G1 of the first thin-film transistor T1 may function as the first electrode CE1 of the first capacitor Cst, and the second electrode CE2 of the first capacitor Cst may overlap at least a portion of the first gate electrode G1.

According to an embodiment, the third pixel circuit PC3 may include a bottom shielding layer BSL that is below the third semiconductor layer A3 of the third thin-film transistor T3 of the third pixel circuit PC3 and overlaps at least a portion of the third semiconductor layer A3 on a plane. For example, the bottom shielding layer BSL may completely overlap the third semiconductor layer A3, or may overlap at least the third channel region C3 of the third semiconductor layer A3. For example, the bottom shielding layer BSL may include a same material as that of the second electrode CE2 of the first capacitor Cst.

Because the third pixel circuit PC3 of the third display area DA3 is adjacent to the transmission area TA of the second display area DA2, light incident onto the electronic component 20 through the transmission area TA may be reflected from the electronic component 20 and incident onto the third pixel circuit PC3. An oxide semiconductor may be vulnerable to light. Therefore, such light may adversely affect the third semiconductor layer A3 of the third thin-film transistor T3 of the third pixel circuit PC3 including the oxide semiconductor material, and may deteriorate device characteristics and reliability of the third thin-film transistor T3. However, the bottom shielding layer BSL according to an embodiment may shield light incident onto the third thin-film transistor T3, thereby preventing such a problem. Therefore, a deterioration in display quality may be prevented.

Although the above description has been given focusing on the third thin-film transistor T3, this is merely an example. The same may apply to other thin-film transistors including the oxide-based semiconductor, for example, the fourth thin-film transistor T4 of the third pixel circuit PC3 (see FIG. 3). That is, the bottom shielding layer BSL may be below the fourth thin-film transistor T4 and overlap at least a portion of the fourth thin-film transistor T4.

According to an embodiment, a wiring layer WL that includes a same material as that of the third gate electrode G3 of the third thin-film transistor T3 of the third pixel circuit PC3 and is on the same layer as the third gate electrode G3 of the third thin-film transistor T3 of the third pixel circuit PC3 may be provided. The wiring layer WL may be one of the signal lines configured to transmit an electrical signal to the third pixel circuit PC3. The wiring layer WL may be electrically connected to the bottom shielding layer BSL through first contact holes CNT1 in the third display area DA3. The first contact holes CNT1 may be formed in insulating layers between the wiring layer WL and the bottom shielding layer BSL. For example, as illustrated in FIG. 5, the first contact holes CNT1 may be formed in the third gate insulating layer 115 and the first interlayer insulating layer 114. The bottom shielding layer BSL may receive a certain electrical signal from the wiring layer WL, and may not be electrically floating. In this manner, the third semiconductor layer A3 of the third thin-film transistor T3 may have stable electrical characteristics.

According to an embodiment, a second bottom metal layer BML2 may be below the third pixel circuit PC3. For example, the second bottom metal layer BML2 may be between the substrate 100 and the third pixel circuit PC3. For example, the second bottom metal layer BML2 may be between the substrate 100 and the first semiconductor layer A1 of the first thin-film transistor T1 of the third pixel circuit PC3. The second bottom metal layer BML2 may include a same material as that of the first bottom metal layer BML1 of the second display area DA2.

For example, the second bottom metal layer BML2 may completely overlap the third pixel circuit PC3. As another example, the second bottom metal layer BML2 may partially overlap the third pixel circuit PC3. In this case, the second bottom metal layer BML2 may overlap at least the first semiconductor layer A1 of the first thin-film transistor T1 of the third pixel circuit PC3.

According to an embodiment, the second bottom metal layer BML2 may be below the first semiconductor layer A1 of the first thin-film transistor T1 of the third pixel circuit PC3, and may overlap the first semiconductor layer A1 on a plane. The second bottom metal layer BML2 may prevent light incident onto the electronic component 20 through the transmission area TA from being reflected from the electronic component 20 and then incident onto the first semiconductor layer A1 of the first thin-film transistor T1 of the third pixel circuit PC3. Therefore, a deterioration in device characteristics and performance of the first thin-film transistor T1 of the third pixel circuit PC3 may be prevented. Therefore, a deterioration in display quality may be prevented.

Although not illustrated, the second bottom metal layer BML2 may be electrically connected to the third pixel circuit PC3 and receive a constant voltage. In this manner, the first thin-film transistor T1 of the third pixel circuit PC3 may have stable electrical characteristics.

According to an embodiment, a light shielding portion 500 including at least two conductive layers may be in the third display area DA3. According to an embodiment, the light shielding portion 500 may be closer to the second display area DA2 than the third pixel circuit PC3 on a plane. That is, the light shielding portion 500 may be between the area in which the third pixel circuit PC3 is arranged and the transmission area TA of the second display area DA2 on a plane.

According to an embodiment, the light shielding portion 500 may include a first conductive layer 510 and a second conductive layer 520 on the first conductive layer 510. That is, the first conductive layer 510 and the second conductive layer 520 may be on different layers from each other. For example, the first conductive layer 510 may include a same material as that of the first gate electrode G1 of the first thin-film transistor T1, the third gate electrode G3 of the third thin-film transistor T3, or the second electrode CE2 of the first capacitor Cst and may be on the same layer as the first gate electrode G1 of the first thin-film transistor T1, the third gate electrode G3 of the third thin-film transistor T3, or the second electrode CE2 of the first capacitor Cst. As an example, FIG. 5 illustrates that the first conductive layer 510 is on the same layer as the first gate electrode G1.

The second conductive layer 520 may be on the second interlayer insulating layer 116. For example, the second conductive layer 520 may be between the second interlayer insulating layer 116 and the first planarization layer 117. As another example, the second conductive layer 520 may be between the first planarization layer 117 and the second planarization layer 118. The second conductive layer 520 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single-layer structure or a multilayer structure including the above-described material.

According to an embodiment, the first conductive layer 510 and the second conductive layer 520 of the light shielding portion 500 may be electrically connected to each other through a second contact hole CNT2 in the third display area DA3. For example, as described above with reference to FIG. 4, when a plurality of light shielding portions 500 are arranged along the edge of the second display area DA2, the second contact holes CNT2 may be provided in the light shielding portions 500 and may be arranged along the edge of the second display area DA2 on a plane. As another example, when the light shielding portions 500 are integrally formed with each other and extend along the edge of the second display area DA2, the second contact holes CNT2 may also extend along the edge of the second display area DA2 on a plane.

External light incident onto the display device 10 may be obliquely incident in a direction having a certain angle with respect to a direction perpendicular to one surface of the substrate 100. Such light may be incident in a lateral direction from the transmission area TA of the second display area DA2 toward the third pixel circuit PC3 of the third display area DA3. The term "lateral direction" may refer to a direction having a component in the x direction or the y direction in FIG. 5, and may refer to a direction from the transmission area TA toward the third pixel circuit PC3 on a plane. Also, a portion of light passing through the transmission area TA may be reflected by various elements in the second display area DA2 and incident onto the third pixel circuit PC3 in the lateral direction from the transmission area TA. The bottom shielding layer BSL and the second bottom metal layer BML2 may shield light incident from the bottom of the third pixel circuit PC3, but may have difficulty in shielding light incident onto the third pixel circuit PC3 in the lateral direction.

However, according to an embodiment, because the light shielding portion 500 includes the first conductive layer 510 and the second conductive layer 520, which are on different layers from each other, and the contact structure connecting the first conductive layer 510 to the second conductive layer 520, the light shielding portion 500 may function as a wall that shields light incident onto the third pixel circuit PC3 in the lateral direction. Therefore, a deterioration in the device characteristics and reliability of the thin-film transistors of the third pixel circuit PC3, specifically, the oxide-based thin-film transistors, due to light unintentionally incident in the lateral direction from the transmission area TA toward the third pixel circuit PC3 may be prevented. Therefore, a deterioration in display quality may be prevented.

According to an alternative embodiment, the light shielding portion 500 may further include a third conductive layer 530 that includes a same material as that of the first and second bottom metal layers BML1 and BML2 and is on the same layer as the first and second bottom metal layers BML1 and BML2. The third conductive layer 530 of the light shielding portion 500 may be electrically connected to the first conductive layer 510 through a third contact hole CNT3. Even in this case, the third contact hole CNT3 may also be arranged and/or extended along the edge of the second display area DA2 on a plane. Due to the additional inclusion of the third conductive layer 530, a range in which the light shielding portion 500 shields light traveling in the lateral direction may be increased.

Figure 6:
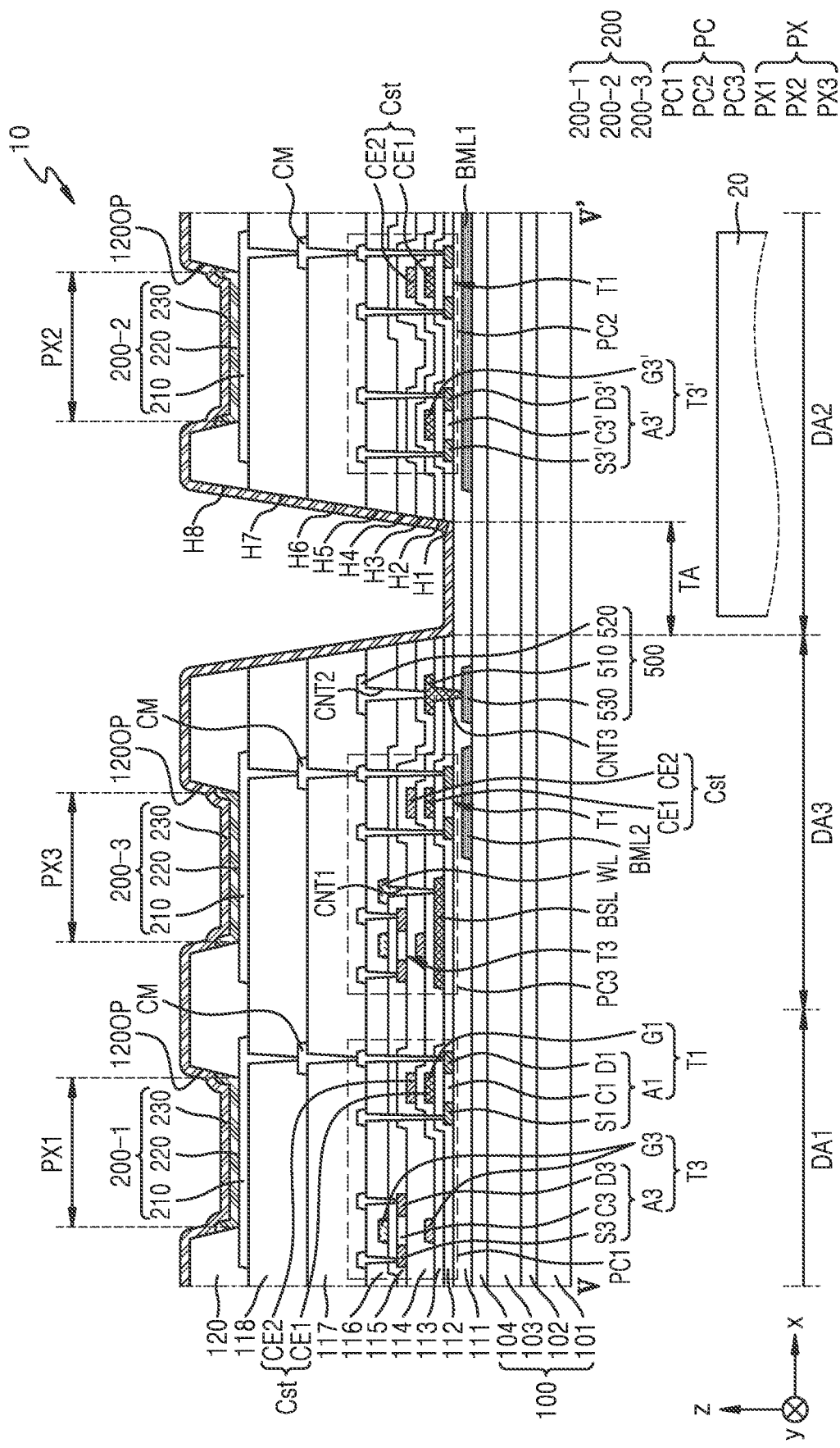
FIG. 6 is a schematic cross-sectional view of a portion of a display device according to another embodiment.
Figure 7:
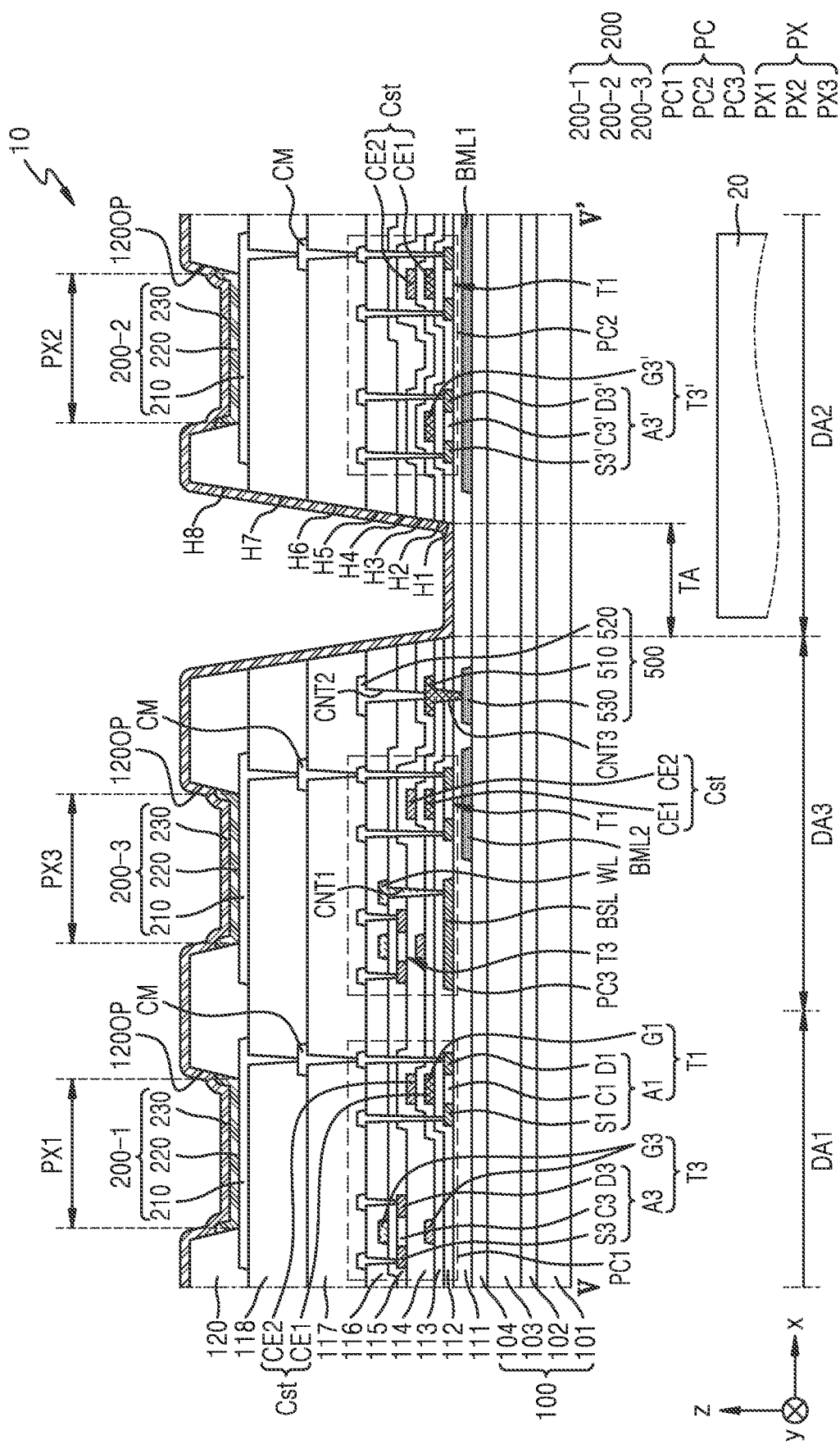
FIG. 7 is a schematic cross-sectional view of a portion of a display device according to another embodiment.

FIG. 6 is a schematic cross-sectional view of a portion of a display device according to another embodiment, and FIG. 7 is a schematic cross-sectional view of a portion of a display device according to another embodiment. A description of elements that are the same as or corresponding to the elements described above with reference to FIG. 5 will be omitted, and the following description will be mainly given focusing on differences.

Referring to FIG. 6, third thin-film transistors T3 of a first pixel circuit PC1 and a third pixel circuit PC3 may have a double gate structure. Specifically, a third gate electrode G3 of the third thin-film transistor T3 may include a lower gate electrode below a third semiconductor layer A3 and overlapping at least a portion of the third semiconductor layer A3, and an upper gate electrode above the third semiconductor layer A3 and overlapping the lower gate electrode.

According to another embodiment, a bottom shielding layer BSL may include a same material as that of a first gate electrode G1 of a first thin-film transistor T1 and may be on the same layer as the first gate electrode G1 of the first thin-film transistor T1. The bottom shielding layer BSL may be electrically connected to a wiring layer WL thereabove through first contact holes CNT1. In this case, the first contact holes CNT1 may be formed in a third gate insulating layer 115, a first interlayer insulating layer 114, and a second gate insulating layer 113.

Referring to FIG. 7, a bottom shielding layer BSL may include a same material as that of a first semiconductor layer A1 of a first thin-film transistor T1 and may be on the same layer as the first semiconductor layer A1 of the first thin-film transistor T1. That is, the bottom shielding layer BSL may include a silicon semiconductor material. Even in this case, the bottom shielding layer BSL may be electrically connected to a wiring layer WL thereabove through first contact holes CNT1. At this time, the first contact holes CNT1 may be formed in a third gate insulating layer 115, a first interlayer insulating layer 114, a second gate insulating layer 113, and a first gate insulating layer 112. As such, the position at which the bottom shielding layer BSL is formed in the stack structure of the display device 10 may be variously modified and designed according to the structure of the third pixel circuit PC3.

Figure 8:
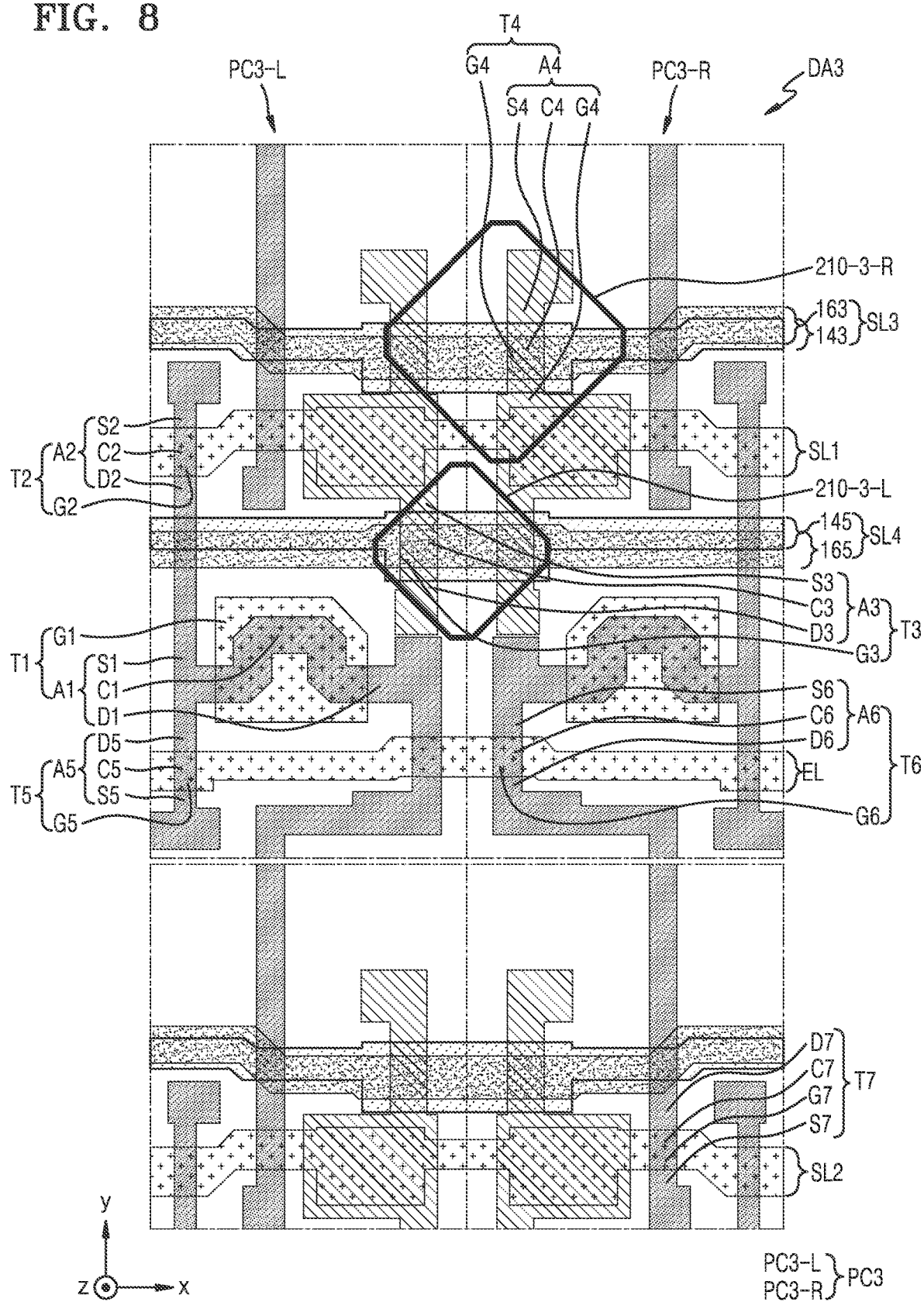
FIG. 8 is a schematic layout diagram of some elements of the display device, according to an embodiment.

FIG. 8 is a schematic layout diagram of some elements of a display device, according to an embodiment. FIG. 8 illustrates some elements of a pair of third pixel circuits PC3 in the same row of adjacent columns. A third pixel circuit PC3-L on a left side and a third pixel circuit PC3-R on a right side in FIG. 8 have a bilaterally symmetrical structure.

FIG. 8 illustrates first to seventh thin-film transistors T1, T2, T3, T4, T5, T6, and T7 of a third pixel circuit PC3, and a first scan line SL1, a second scan line SL2, a third scan line SL3, a fourth scan line SL4, and an emission control line EL, which extend in a first direction (e.g., x direction).

The second scan line SL2 illustrated in FIG. 8 may be a first scan line SL1 of a next row. That is, the first scan line SL1 illustrated in FIG. 8 may be a second scan line SL2 of a previous row. FIG. 8 illustrates a seventh thin-film transistor T7 connected to a pixel circuit of a previous row and arranged in a circuit area of a current row, and a seventh thin-film transistor T7 connected to a pixel circuit of the current row and arranged in a circuit area of a next row. Hereinafter, for convenience of illustration and description, the seventh thin-film transistor T7 in the circuit area of the current row will be described as an example.

The semiconductor layers A1, A2, A5, A6, and A7 of the first thin-film transistor T1, the second thin-film transistor T2, the fifth thin-film transistor T5, the sixth thin-film transistor T6, and the seventh thin-film transistor T7 may be on the same layer as each other and may include polycrystalline silicon. The semiconductor layers A1, A2, A5, A6, and A7 may be connected to each other and may be bent in various shapes.

The first thin-film transistor T1 includes the first semiconductor layer A1 and a first gate electrode G1. The first semiconductor layer A1 may include a first channel region C1, and a first source region S1 and a first drain region D1 on both sides of the first channel region C1. The first semiconductor layer A1 may have a curved shape, so that the first channel region C1 is longer than the other channel regions C2 to C7. For example, because the first semiconductor layer A1 has a shape, such as "S," "M," or "W," which is bent multiple times, a long channel length may be formed in a narrow space. Because the first channel region C1 is formed to be long, a driving range of a gate voltage applied to the first gate electrode G1 is widened. Therefore, the gray scale of light emitted from the organic light-emitting diode OLED may be controlled more precisely, and display quality may be improved. The first gate electrode G1 may have an isolated shape and overlap the first channel region C1.

The second thin-film transistor T2 may include the second semiconductor layer A2 and a second gate electrode G2. The second semiconductor layer A2 may include a second channel region C2, and a second source region S2 and a second drain region D2 on both sides of the second channel region C2. The second source region S2 may be electrically connected to the data line DL, and the second drain region D2 may be connected to the first source region S1. The second gate electrode G2 may be provided as a portion of the first scan line SL1.

The fifth thin-film transistor T5 may include a fifth semiconductor layer A5 and a fifth gate electrode G5. The fifth semiconductor layer A5 may include a fifth channel region C5, and a fifth source region S5 and a fifth drain region D5 on both sides of the fifth channel region C5. The fifth source region S5 may be electrically connected to a power supply voltage line (not illustrated), and the fifth drain region D5 may be connected to the first source region S1. The fifth gate electrode G5 may be provided as a portion of the emission control line EL.

The sixth thin-film transistor T6 may include the sixth semiconductor layer A6 and a sixth gate electrode G6. The sixth semiconductor layer A6 may include a sixth channel region C6, and a sixth source region S6 and a sixth drain region D6 on both sides of the sixth channel region C6. The sixth source region S6 may be connected to the first drain region D1, and the sixth drain region D6 may be electrically connected to the pixel electrode 210 (see FIG. 5) of the organic light-emitting diode OLED. The sixth gate electrode G6 may be provided as a portion of the emission control line EL.

The seventh thin-film transistor T7 may include the seventh semiconductor layer A7 and a seventh gate electrode G7. The seventh semiconductor layer A7 may include a seventh channel region C7, and a seventh source region S7 and a seventh drain region D7 on both sides of the seventh channel region C7. The seventh source region S7 may be electrically connected to a second initialization voltage line (not illustrated), and the seventh drain region D7 may be connected to the sixth drain region D6. The seventh gate electrode G7 may be provided as a portion of the second scan line SL2.

The semiconductor layers A3 and A4 of the third thin-film transistor T3 and the fourth thin-film transistor T4 may be on the same layer as each other, and may include an oxide semiconductor.

The third thin-film transistor T3 includes the third semiconductor layer A3 and a third gate electrode G3. The third semiconductor layer A3 may include a third channel region C3, and a third source region S3 and a third drain region D3 on both sides of the third channel region C3. The third source region S3 may be bridged to the first gate electrode G1 through a node connection line (not illustrated). Also, the third source region S3 may be connected to the fourth drain region D4 on the same layer. The third drain region D3 may be electrically connected to the first semiconductor layer A1 of the first thin-film transistor T1 and the sixth semiconductor layer A6 of the sixth thin-film transistor T6. The third gate electrode G3 may be provided as a portion of the fourth scan line SL4.

The fourth thin-film transistor T4 may include the fourth semiconductor layer A4 and a fourth gate electrode G4. The fourth semiconductor layer may include a fourth channel region C4, and a fourth source region S4 and a fourth drain region D4 on both sides of the fourth channel region C4. The fourth source region S4 may be electrically connected to a first initialization voltage line (not illustrated), and the fourth drain region D4 may be bridged to the first gate electrode G1 through a node connection line (not illustrated). The fourth gate electrode G4 may be provided as a portion of the third scan line SL3.

According to an alternative embodiment, some wirings may include two conductive layers on different layers from each other. For example, the third scan line SL3 may include a lower scan line 143 and an upper scan line 163, which are on different layers from each other. The lower scan line 143 may include a same material as that of the second electrode CE2 of the first capacitor Cst and may be on the same layer as the second electrode CE2 of the first capacitor Cst. The lower scan line 143 may be arranged to overlap at least a portion of the upper scan line 163. Because the lower scan line 143 and the upper scan line 163 may correspond to a portion of the third gate electrode G3 of the third thin-film transistor T3, the third thin-film transistor T3 may have a double gate structure including control electrodes below and above the third semiconductor layer A3.

Also, the fourth scan line SL4 may include a lower scan line 145 and an upper scan line 165, which are on different layers from each other. The lower scan line 145 may include a same material as that of the second electrode CE2 of the first capacitor Cst and may be on the same layer as the second electrode CE2 of the first capacitor Cst. The lower scan line 145 may be arranged to overlap at least a portion of the upper scan line 165. Because the lower scan line 145 and the upper scan line 165 may correspond to a portion of the fourth gate electrode G4 of the fourth thin-film transistor T4, the fourth thin-film transistor T4 may have a double gate structure including control electrodes below and above the fourth semiconductor layer A4.

According to an embodiment, the third light-emitting elements 200-3 may overlap the oxide-based thin-film transistors of the corresponding third pixel circuit PC3, respectively. As an example, a pixel electrode 210-3-L of the third light-emitting element electrically connected to a third pixel circuit PC3-L on the left side may overlap a third thin-film transistor T3 of the third pixel circuit PC3-L on a plane. Also, a pixel electrode 210-3-R of the third light-emitting element electrically connected to a third pixel circuit PC3-R on the right side may overlap a fourth thin-film transistor of the third pixel circuit PC3-R on a plane.

Of course, this is merely an example, and the arrangement of the pixel electrodes 210-3-L and 210-3-R may be variously modified. As another example, the pixel electrode 210-3-L may overlap the fourth thin-film transistor T4 of the third pixel circuit PC3-L on the left side on a plane, and the pixel electrode 210-3-R may overlap the third thin-film transistor T3 of the third pixel circuit PC3-R on the right side on a plane. As another example, the pixel electrode 210-3-L may overlap both the third thin-film transistor T3 and the fourth thin-film transistor T4 of the third pixel circuit PC3-L on the left side, and the pixel electrode 210-3-R may overlap both the third thin-film transistor T3 and the fourth thin-film transistor T4 of the third pixel circuit PC3-R on the right side.

As described above, because the oxide semiconductor of the oxide-based thin-film transistor may be vulnerable to external light, the pixel electrode 210 may be arranged to overlap the oxide semiconductor, such that the possibility that external light incident from above the display device 10 will reach the oxide semiconductor may be significantly reduced. Therefore, a deterioration in device characteristics and reliability of the oxide-based thin-film transistors, for example, the third thin-film transistor T3 and the fourth thin-film transistor T4 may be prevented and a deterioration in display quality may be prevented.

Only the display device has been mainly described, but the disclosure is not limited thereto. For example, it will be understood that a method of manufacturing the display device also falls within the scope of the present disclosure.

As described above, according to one or more embodiments, a display device in which power consumption is reduced and a display area is expanded to allow an image to be displayed even in an area in which an electronic component is arranged may be implemented. Also, a display device in which pixel circuits around an area in which an electronic component is arranged are protected from external light, such that a deterioration in display quality is prevented, may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a first display area in which a plurality of first light-emitting elements are arranged;
a second display area in which a plurality of second light-emitting elements are arranged, the second display area comprising a transmission area;
a third display area in which a plurality of third light-emitting elements are arranged, the third display area being between the first display area and the second display area; and
a plurality of pixel circuits in the third display area and electrically connected to the plurality of third light-emitting elements, respectively,
wherein each of the plurality of pixel circuits comprises:
a first thin-film transistor comprising a first semiconductor layer and a first gate electrode overlapping at least a portion of the first semiconductor layer;
a second thin-film transistor comprising a second semiconductor layer including a material different from that of the first semiconductor layer and a second gate electrode overlapping at least a portion of the second semiconductor layer;
a bottom shielding layer below the second semiconductor layer and overlapping at least a portion of the second semiconductor layer on a plane; and
a wiring layer including a same material as that of the second gate electrode of the second thin-film transistor,
wherein the wiring layer is electrically connected to the bottom shielding layer through a contact hole in the third display area.

2. The display device of claim 1, wherein the first semiconductor layer of the first thin-film transistor includes a silicon semiconductor material, and the second semiconductor layer of the second thin-film transistor includes an oxide semiconductor material.

3. The display device of claim 1, wherein the bottom shielding layer includes a same material as that of the first gate electrode of the first thin-film transistor.

4. The display device of claim 1, wherein the bottom shielding layer includes a same material as that of the first semiconductor layer of the first thin-film transistor.

5. The display device of claim 1, further comprising a bottom metal layer below the first semiconductor layer of the first thin-film transistor and overlapping the first semiconductor layer on a plane.

6. The display device of claim 1, further comprising a light shielding portion in the third display area and comprising at least two conductive layers.

7. The display device of claim 6, wherein the light shielding portion is closer to the second display area than the plurality of pixel circuits on a plane.

8. The display device of claim 6, wherein the light shielding portion is arranged to surround at least a portion of the second display area on a plane.

9. The display device of claim 6, wherein the at least two conductive layers of the light shielding portion comprise:
a first conductive layer including a same material as that of the first gate electrode or the second gate electrode; and
a second conductive layer on the first conductive layer and electrically connected to the first conductive layer.

10. The display device of claim 1, wherein each of the plurality of third light-emitting elements comprises a pixel electrode, an opposite electrode above the pixel electrode, and an intermediate layer between the pixel electrode and the opposite electrode, and the pixel electrode overlaps the second thin-film transistor of each of the plurality of pixel circuits on a plane.

11. A display device comprising:
a first display area in which a plurality of first light-emitting elements are arranged;
a second display area in which a plurality of second light-emitting elements are arranged, the second display area comprising a transmission area;
a third display area in which a plurality of third light-emitting elements are arranged, the third display area being between the first display area and the second display area; and
a plurality of pixel circuits in the third display area and electrically connected to the plurality of third light-emitting elements, respectively,
wherein each of the plurality of pixel circuits comprises:
a first thin-film transistor comprising a first semiconductor layer and a first gate electrode overlapping at least a portion of the first semiconductor layer;
a second thin-film transistor comprising a second semiconductor layer including a material different from that of the first semiconductor layer and a second gate electrode overlapping at least a portion of the second semiconductor layer; and
a bottom shielding layer below the second semiconductor layer and overlapping at least a portion of the second semiconductor layer on a plane,
wherein each of the plurality of pixel circuits further comprises a capacitor electrode overlapping at least a portion of the first gate electrode of the first thin-film transistor, and
the bottom shielding layer includes a same material as that of the capacitor electrode.

12. A display device comprising:
a first display area in which a plurality of first light-emitting elements are arranged;
a second display area in which a plurality of second light-emitting elements are arranged, the second display area comprising a transmission area;
a third display area in which a plurality of third light-emitting elements are arranged, the third display area being between the first display area and the second display area; and
a plurality of pixel circuits in the third display area and electrically connected to the plurality of third light-emitting elements, respectively,
wherein each of the plurality of pixel circuits comprises:
a first thin-film transistor comprising a first semiconductor layer and a first gate electrode overlapping at least a portion of the first semiconductor layer;
a second thin-film transistor comprising a second semiconductor layer including a material different from that of the first semiconductor layer and a second gate electrode overlapping at least a portion of the second semiconductor layer;
a light shielding portion in the third display area and comprising a plurality of conductive layers; and
a bottom metal layer below the first semiconductor layer of the first thin-film transistor and overlapping the first semiconductor layer on a plane,
wherein the plurality of conductive layers of the light shielding portion comprises:
a first conductive layer including a same material as that of the first gate electrode or the second gate electrode;
a second conductive layer on the first conductive layer and electrically connected to the first conductive layer, and a third conductive layer including a same material as that of the bottom metal layer and electrically connected to the first conductive layer.

13. A display device comprising:
a substrate comprising a first area, a second area, and a third area between the first area and the second area;
a first semiconductor layer on the substrate in the third area and including a silicon semiconductor material;
a first insulating layer covering the first semiconductor layer;
a first gate electrode on the first insulating layer and overlapping at least a portion of the first semiconductor layer;
a second insulating layer covering the first gate electrode;
a second semiconductor layer on the second insulating layer in the third area and including an oxide semiconductor material;
a third insulating layer covering the second semiconductor layer;
a second gate electrode on the third insulating layer and overlapping at least a portion of the second semiconductor layer;
a bottom shielding layer between the substrate and the second semiconductor layer and overlapping at least a portion of the second semiconductor layer on a plane; and
a wiring layer on the third insulating layer and including a same material as that of the second gate electrode,
wherein each of the first to third insulating layers comprises a hole overlapping a portion of the second area, and
the bottom shielding layer is electrically connected to the wiring layer through a contact hole in the third area.

14. The display device of claim 13, wherein the bottom shielding layer includes a same material as that of the first gate electrode or the first semiconductor layer.

15. The display device of claim 13, further comprising a bottom metal layer between the substrate and the first semiconductor layer and overlapping the first semiconductor layer on a plane.

16. The display device of claim 13, further comprising:
a fourth insulating layer covering the second gate electrode; and
a light shielding portion in the third area,
wherein the light shielding portion comprises:
a first conductive layer on a same layer as the first gate electrode or the second gate electrode; and
a second conductive layer on the fourth insulating layer and having a portion electrically connected to the first conductive layer through a contact hole in the fourth insulating layer.

17. The display device of claim 16, wherein the light shielding portion is closer to the second area than a region of the third area in which the second semiconductor layer is arranged, on a plane.

18. The display device of claim 16, wherein the light shielding portion is arranged to surround at least a portion of the second area on a plane.

* * * * *